United States Patent
Kang et al.

(10) Patent No.: US 7,359,268 B2
(45) Date of Patent: Apr. 15, 2008

(54) SEMICONDUCTOR MEMORY DEVICE FOR LOW VOLTAGE

(75) Inventors: Hee-Bok Kang, Ichon-shi (KR); Jin-Hong Ahn, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/319,080

(22) Filed: Dec. 28, 2005

(65) Prior Publication Data
US 2006/0221665 A1 Oct. 5, 2006

(30) Foreign Application Priority Data
Mar. 31, 2005 (KR) .................. 10-2005-0027341

(51) Int. Cl.
*G11C 7/00* (2006.01)
(52) U.S. Cl. ................ 365/208; 365/190; 365/201; 365/203
(58) Field of Classification Search ......... 365/208, 365/204
See application file for complete search history.

(56) References Cited

U.S. PATENT DOCUMENTS

| | | | | |
|---|---|---|---|---|
| 4,586,167 A | * | 4/1986 | Fujishima et al. | 365/189.05 |
| 4,656,608 A | * | 4/1987 | Aoyama | 365/190 |
| 4,661,928 A | * | 4/1987 | Yasuoka | 365/189.05 |
| 4,943,944 A | * | 7/1990 | Sakui et al. | 365/189.05 |
| 4,943,949 A | * | 7/1990 | Yamaguchi et al. | 365/206 |
| 5,065,363 A | * | 11/1991 | Sato et al. | 365/154 |
| 5,291,432 A | * | 3/1994 | Furutani | 365/51 |
| 5,305,261 A | * | 4/1994 | Furutani et al. | 365/189.01 |
| 5,333,127 A | | 7/1994 | Hiraki et al. | |
| 5,500,820 A | * | 3/1996 | Nakaoka | 365/189.01 |
| 5,657,286 A | * | 8/1997 | Arimoto | 365/205 |
| 5,729,500 A | * | 3/1998 | Shinozaki | 365/230.01 |
| 5,946,252 A | * | 8/1999 | Arimoto | 365/205 |
| 5,953,249 A | | 9/1999 | van der Wagt | |
| 6,026,035 A | * | 2/2000 | Kim | 365/190 |
| 6,853,591 B2 | | 2/2005 | Schreck | |
| 7,126,867 B2 | * | 10/2006 | Kang et al. | 365/203 |
| 7,145,821 B2 | * | 12/2006 | Kang et al. | 365/203 |
| 7,251,174 B2 | * | 7/2007 | Kang et al. | 365/203 |

FOREIGN PATENT DOCUMENTS

| | | |
|---|---|---|
| JP | 4-368695 A | 12/1992 |
| JP | 10-340581 | 12/1998 |
| JP | 2005-51044 | 2/2005 |
| KR | 1998-067036 | 10/1998 |
| KR | 10-2004-0065322 | 7/2004 |

* cited by examiner

*Primary Examiner*—Tan T. Nguyen
(74) *Attorney, Agent, or Firm*—McDermott Will & Emery LLP

(57) ABSTRACT

A semiconductor memory device includes a read amplifying unit for transferring a data from a local data line pair to a global data line as a read data; a write driver for transferring a write data from the global data line to the local data line pair; and an input/output (I/O) switching unit for transferring the read data from a segment data line pair to the local data line pair and for transferring the write data from the local data line pair to the segment data line pair, wherein each of the local data line pair and the segment line pair includes a VDD precharge block.

19 Claims, 15 Drawing Sheets

SEMICONDUCTOR MEMORY DEVICE FOR LOW VOLTAGE

FIELD OF THE INVENTION

The present invention relates to a semiconductor memory device; and, more particularly, to a semiconductor memory device for efficiently operating under a low power supply voltage condition.

DESCRIPTION OF RELATED ARTS

FIG. 1 is a block diagram showing a core area of a conventional semiconductor memory device.

As shown, the conventional semiconductor memory device includes a row address decoder 20, a column address decoder 30, a cell area 100 and a data input/output block 40.

The cell area 100 includes a plurality of cell arrays, e.g., 110, 120, 130 and 140 and a plurality of sense amplifying blocks, e.g., 150 and 160. The row address decoder 20 receives a row address and decodes the row address in order to access a data stored in the cell area 100; and the column address decoder 30 receives a column address and decodes the column address in order to access the data stored in the cell area 100. The data input/output block 40 is for outputting a data stored in the cell area 100 or delivering data inputted through a data pad/pin into the cell area 100.

That is, during a read operation, the data accessed in response to the row address and the column address is outputted to the data input/output block 40. Otherwise, under a write operation, a data inputted from an external circuit is stored in a unit cell corresponding to the row address and the column address through the data input/output block 40.

In detail, each cell array, e.g., 110, included in the cell area 100 includes a plurality of unit cells, each for storing a data; and each sense amplifying block, e.g., 150, is for sensing and amplifying data outputted from each cell array.

FIG. 2 is a block diagram depicting a detailed structure of the cell area 100 shown in FIG. 1.

As shown, a first cell array 110 includes a plurality of bit line pairs, e.g., BL and /BL, a plurality of cells, e.g., CELL1, CELL2 and CELL3, and a plurality of word lines, e.g., WL0 to WL5. Herein, each cell is constituted with one capacitor and one transistor. For instance, a first cell CELL1 includes a first capacitor C0 coupled to a plate line PL and a first MOS transistor M0 having a gate coupled to a first word line WL0. The first MOS transistor M0 is coupled between the first capacitor C0 and a bit line BL for connecting or disconnecting the first capacitor C0 to a bit line BL in response to a word line WL0.

Also, the first cell CELL1 and a second cell CELL2 respectively coupled to the first word line WL0 and a second word line WL1 and neighbored with each other are commonly connected to the bit line BL; and the bit line BL is coupled to a sense amplifier 152a included in the sense amplifying block 150.

For reading a data stored in the first cell CELL1, the first word line W0 is selected and activated; then, as a result, the first MOS transistor M0 is turned on. The data stored in the first capacitor C0 is delivered into the bit line BL.

Next, the sense amplifier 152a senses and amplifies the data by using a potential difference between the bit line BL receiving the data delivered through the first MOS transistor M0 and a bit line bar /BL receiving no data outputted from any cell included in the first cell array 110.

After above described sensing and amplifying operations by the sense amplifier 152a, the amplified data is outputted through a local data bus pair LDB and LDBB to the external circuit. Herein, under the sensing and amplifying operations, the sense amplifier 152a determines logic levels of the bit line BL and the bit line bar /BL. Also, each logic level of the bit line BL and the bit line bar /BL is transmitted to each of a local data bus LDB and a local data bus bar LDBB.

That is, if the first cell CELL1 stores a data being a logic high level "1", i.e., the first capacitor C0 is charged, the bit line BL has a voltage level of a supply voltage VDD and the bit line bar /BL has a voltage level of a ground GND after the sensing and amplifying operations. Otherwise, i.e., if the first cell CELL1 stores a data being a logic low level "0", the bit line BL has a voltage level of the ground GND and the bit line bar /BL has a voltage level of the supply voltage VDD after the sensing and amplifying operations.

Since an amount of charge stored in each capacitor of each cell is a little, the charge should be restored in a capacitor of each original cell after the charge is delivered into the bit line BL. After completing the restoration by using a latched data of the sense amplifier, a word line corresponding to the original cell is inactivated.

Herein, it is described when a data stored in the third cell CELL3 is read. If the third cell CELL3 stores a data being a logic high level "1", i.e., the third capacitor C2 is charged, the bit line bar /BL has a voltage level of the supply voltage VDD and the bit line BL has a voltage level of the ground GND after the sensing and amplifying operations. Otherwise, i.e., if the third cell CELL3 stores a data being a logic low level "0", the bit line bar /BL has a voltage level of the ground GND and the bit line BL has a voltage level of the supply voltage VDD after the sensing and amplifying operations.

Further, in the write operation, i.e., when an inputted data is stored in the cell area, a word line corresponding to inputted row and column addresses is activated and, then, a data stored in a cell coupled to the word line is sensed and amplified. After then, the amplified data is substituted with the inputted data in the sense amplifier 152a. That is, the inputted data is latched in the sense amplifier 152a. Next, the inputted data is stored in the cell corresponding to the activated word line. If it is completed to store the inputted data in the cell, the word line corresponding to the inputted row and column addresses is inactivated.

FIG. 3 is a block diagram describing a connection between each cell array and each sense amplifying block included in the cell area 100 shown in FIG. 1. Particularly, the conventional semiconductor memory device has a shared bit line sense amplifier structure. Herein, the shared bit line sense amplifier structure means that two neighbor cell arrays are coupled to one sense amplifying block.

As shown, there are a plurality of cell arrays 110, 130 and 180 and a plurality of sense amplifying blocks 150 and 170. The first sense amplifying block 150 is coupled to the first cell array 110 and the second cell array 130; and the second sense amplifying block 170 is coupled to the second cell array 130 and the fifth cell array 180.

If one cell array is coupled to one sense amplifying block, the sense amplifying block includes a plurality of sense amplifiers each corresponding to each bit line pair included in the cell array. That is, the number of the sense amplifiers included in the sense amplifying block is same to the number of bit lines included in the cell array. However, referring to FIG. 3, since two cell arrays hold one sense amplifying block in common under the shared bit line sense amplifier structure, the sense amplifying block has a number of sense amplifiers each corresponding to each two bit line pairs. That is, the number of the sense amplifiers included in the sense amplifying block can be decreased by half.

Under the shared bit line sense amplifier structure for implementing a higher integrated circuit, the sense amplifying block, e.g., 150, further includes a first connection block 151 and a second connection block 153. Since the sense amplifying block is commonly coupled to two neighbor cell arrays 110 and 130, there should be control for connecting or disconnecting the first sense amplifying block 150 to one of the two neighbor cell arrays 110 and 130. Each of the first and the second connection blocks 151 and 153 has a plurality of switching units, e.g., transistors. The plurality of transistors, e.g., MN1 to MN4, in the first connection block 151 is turned on or off based on a first connection control signal BISH1; and the plurality of transistors, e.g., MN5 to MN8, in the second connection block 153 is turned on or off based on a second connection control signal BISL1.

For instance, if the first connection control signal BISH1 is activated, all transistors included in the first connection block 151 is turned on, that is, the first cell array 110 is coupled to the sense amplifier block 152 of the first sense amplifying block 150. Otherwise, if the second connection control signal BISL1 is activated, all transistors included in the second connection block 153 is turned on, that is, the second cell array 130 is coupled to the sense amplifier block 152 of the first sense amplifying block 150.

Likewise, another sense amplifying block 170 includes a plurality of sense amplifiers and two connection blocks controlled in response to other connection control signals BISH2 and BISL2 for connecting or disconnecting a sense amplifier block of the sense amplifying block 170 to one of the two neighbor cell arrays 130 and 180.

Moreover, each sense amplifying block, e.g., 150, further includes a precharge block and a data output block except for connection blocks and sense amplifiers.

FIG. 4 is a block diagram depicting the sense amplifying block 150 shown in FIG. 2.

As shown, the sense amplifying block 150 includes a sense amplifier 152a, a precharge block 155a, first and second equalization blocks 154a and 157a and a data output block 156a.

The sense amplifier 152a receives power supply signals SAP and SAN for amplifying a potential difference between the bit line BL and the bit line bar /BL. Enabled by a precharge signal BLEQ when the sense amplifier 152a is not activated, the precharge block 155a is for precharging the bit line pair BL and /BL as a bit line precharge voltage VBLP. In response to the precharge signal BLEQ, the first equalization block 154a makes a voltage level of the bit line BL be same to a voltage level of the bit line bar /BL. Similar to the first equalization block 154a, the second equalization block 157a is also used for making a voltage level of the bit line BL be same to a voltage level of the bit line bar /BL. Lastly, the data output block 156a outputs a data amplified by the sense amplifier 152a to the local data bus pair LDB and LDBB based on a column control signal YI generated from a column address.

Herein, the sense amplifying block 150 further includes two connection blocks 151a and 153a each for connecting or disconnecting the sense amplifier 152a to one of neighbor cell arrays respectively based on connection control signals BISH and BISL.

FIG. 5 is a waveform showing an operation of the conventional semiconductor memory device. Hereinafter, referring to FIGS. 1 to 5, the operation of the conventional semiconductor memory device is described in detail.

As shown, the read operation can be split into four steps: a precharge step, a read step, a sense step and a restore step. Likewise, the write operation is very similar to the read operation. However, the write operation includes a write step instead of the read step in the read operation and, more minutely, not a sensed and amplified data is not outputted but an inputted data from an external circuit is latched in the sense amplifier during the sense step.

Hereinafter, it is assumed that a capacitor of a cell is charged, i.e., stores a logic high data "1". Herein, a symbol 'SN' means a potential level charged in the capacitor of the cell. Also, one of two connection blocks in the sense amplifying block is activated and the other is inactivated. As a result, the sense amplifying block is coupled to one of two neighbor cell arrays.

In the precharge step, the bit line BL and the bit line bar /BL are precharged by the bit line precharge voltage VBLP. At this time, all word lines are inactivated. Generally, the bit line precharge voltage VBLP is a ½ core voltage, i.e., ½Vcore=VBLP.

When the precharge signal BLEQ is activated as a logic high level, the first and second equalization blocks 154a and 157a are also enabled. Thus, the bit line BL and the bit line bar /BL are precharged as the ½ core voltage. Herein, the first and second connection block 151a and 153a are also activated, i.e., all transistors included in the first and second connection block 151a and 153a are turned on.

In the read step, a read command is inputted and carried out. Herein, if the first connection block 151a is coupled to the first cell array 110 and the second connection block 153a is coupled to the second cell array 130, the sense amplifier 152a is coupled to the first cell array 110 when the first connection block 151a is activated and the second connection block 153a is inactivated. Otherwise, when the second connection block 153a is activated and the first connection block 151a is inactivated, the sense amplifier 152a is coupled to the second cell array 130 and disconnected to the first cell array 110.

In addition, a word line corresponding to an inputted address is activated by a supply voltage VDD or a high voltage VPP until the restore step.

Herein, for activating the word line, the high voltage VPP is generally used because it is requested that the supply voltage VDD becomes lower and an operating speed of the semiconductor memory device becomes faster.

If the word line is activated, a MOS transistor of the cell corresponding to the word line is turned on; and a data stored in a capacitor of the cell is delivered into the bit line BL.

Thus, the bit line BL precharged by the ½ core voltage is boosted up by a predetermined voltage level ΔV. Herein, though the capacitor is charged as the core voltage Vcore, a voltage level of the bit line BL cannot be increased to the core voltage Vcore because a capacitance Cc of the capacitor is smaller than a worm capacitance Cb of the bit line BL.

Referring to FIG. 5, in the read step, it is understood that a voltage level of the bit line BL is increased by the predetermined voltage level ΔV and the symbol 'SN' is also decreased to that voltage level.

At this time, i.e., when the data is delivered into the bit line BL, no data is delivered into the bit line bar /BL and, then, the bit line bar /BL keeps a ½ core voltage level.

Next, in the sense step, the first power supply signal SAP is supplied with the core voltage Vcore and the second power supply signal SAN is supplied with a ground GND. Then, the sense amplifier can amplify a voltage difference, i.e., a potential difference, between the bit line BL and the bit line bar /BL by using the first and the second power supply signals SAP and SAN. At this time, a relatively high side between the bit line BL and the bit line bar /BL is amplified to the core voltage Vcore; and the other side, i.e., a relatively low side between the bit line BL and the bit line bar /BL, is amplified to the ground GND.

Herein, a voltage level of the bit line BL is higher than that of the bit line bar /BL. That is, after the bit line BL and the bit line bar /BL are amplified, the bit line BL is supplied with the core voltage Vcore and the bit line bar /BL is supplied with the ground GND.

Lastly, in the restore step, the data outputted from the capacitor during the read step for boosting up the bit line BL by the predetermined voltage level ΔV is restored in the original capacitor. That is, the capacitor is re-charged. After the restore step, the word line corresponding to the capacitor is inactivated.

Then, the conventional semiconductor memory device carries out the precharge step again. Namely, the first and the second power supply signals SAP and SAN are respectively supplied with ½ core voltage Vcore. Also, the precharge signal BLEQ is activated and inputted to the first and the second equalization blocks 154a and 157a and the precharge block 155a. At this time, the sense amplifier 152a is coupled to the two neighbor cell arrays, e.g., 110 and 130, by the first and the second connection blocks 151a and 153a.

As a design technology for a semiconductor memory device is rapidly developed, a voltage level of a supply voltage for operating the semiconductor memory device becomes lower. However, though the voltage level of the supply voltage becomes lower, it is requested that an operation speed of the semiconductor memory device becomes faster.

For achieving the request about the operation speed of the semiconductor memory device, the semiconductor memory device includes an internal voltage generator for generating a core voltage Vcore having a lower voltage level than the supply voltage VDD and a high voltage VPP having a higher voltage level than the core voltage Vcore.

Until now, a requested operation speed can be achieved by implementing a nano-scale technology for manufacturing the semiconductor memory device through using above described manner for overcoming a decrease of the voltage level of the supply voltage VDD without any other particular method.

For example, through a voltage level of the supply voltage is decreased from about 3.3 V to about 2.5 V or under 2.5 V, the requested operation speed is achieved if the nano-scale technology is implemented based on from about 500 nm to about 100 nm. This means that the semiconductor memory device is more integrated. That is, as the nano-scale technology is upgraded, i.e., developed, a power consumption of a fabricated transistor included in the semiconductor memory device is reduced and, if the voltage level of the supply voltage is not decreased, an operation speed of the fabricated transistor becomes faster.

However, on the nano-technology based on under 100 nm, it is very difficult to develop the nano-technology. That is, there is a limitation for integrating the semiconductor memory device more and more.

Also, a requested voltage level of the supply voltage becomes lower, e.g., from about 2.0 V to about 1.5 V or so far as about 1.0 V. Thus, the request about the supply voltage cannot be achieved by only developing the nano-technology.

If a voltage level of the supply voltage inputted to the semiconductor memory device is lower than a predetermined voltage level, an operating margin of each transistor included in the semiconductor memory device is not sufficient; and, as a result, a requested operation speed is not satisfied and an operation reliability of the semiconductor memory device is not guaranteed.

Also, the sense amplifier needs more time for stably amplifying a voltage difference between the bit line BL and the bit line bar /BL because a predetermined turned-on voltage, i.e., a threshold voltage, of the transistor is remained under a low supply voltage.

Moreover, if a noise is generated at the bit line pair BL and /BL, each voltage level of the bit line BL and the bit line bar /BL is fluctuated, i.e., increased or decreased by a predetermined level on the ½ core voltage Vcore. That is, as the voltage level of the supply voltage becomes lower, a little noise can seriously affect the operation reliability of the semiconductor memory device.

Therefore, there is a limitation for decreasing a voltage level of the supply voltage under a predetermined level.

In addition, as the semiconductor memory device is more integrated, a size of the transistor becomes smaller and a distance between a gate of the transistor and the bit line gets near more and more. As a result, a bleed current is generated. Herein, the bleed current means a kind of leakage current between the gate of the transistor and the bit line because of a physical distance between the gate of the transistor and the bit line under a predetermined value.

FIG. 6 is a cross-sectional view describing a unit cell of the semiconductor memory device in order to show a cause of the bleed current.

As shown, the unit cell includes a substrate 10, an device isolation layer 11, source and drain regions 12a and 12b, a gate electrode 13, a bit line 17, a capacitor 14 to 16 and insulation layers 18 and 19. Herein, the symbol 'A' means a distance between the gate electrode 13 of the transistor and the bit line 17.

As it is rapidly developed the nano-technology for manufacturing the semiconductor memory device, the distance between the gate electrode 13 of the transistor and the bit line 17, i.e., 'A', becomes shorter.

In the precharge step, the bit line BL is supplied with the ½ core voltage and the gate electrode 13, i.e., a word line, is supplied with the ground.

If the bit line 17 and the gate electrode 13 in an unit cell are electronically short since an error is occurred under a manufacturing process, a current is flown continuously during the precharge step and a power consumption is increased. In this case, the semiconductor memory device includes a plurality of additional unit cells for substituting the unit cell where the bit line and the gate electrode are short-circuited. At this time, error cells are substituted with additional cells in word line basis.

Otherwise, if there is no error under the manufacturing process, i.e., the bit line 17 and the gate electrode 13 in a unit cell are not electronically short-circuited in any cell of the semiconductor memory device, there is no bleed current. However, if the distance between the gate electrode 13 of the transistor and the bit line 17, i.e., 'A', is too short without any error under the manufacturing process, the bleed current is generated and flown.

Recently, how to operate a semiconductor memory device under a low power condition is very important. If above described bleed current is generated, it is not appreciate that the semiconductor memory device having the bleed current is applied to a system though the semiconductor memory device can be normally operated.

For reducing an amount of the bleed current, it is suggested that a resistor is added between the gate electrode of the transistor and the bit line. However, although the resistor can reduce little amount of the bleed current, this is not effective and essential for reducing and protecting a flow of the bleed current.

Further, the conventional semiconductor memory device has another problem. That is, there exists a bleed current between a sense amplifier and a disconnected cell array. As above-mentioned, when one cell array is connected to the sense amplifier, the other cell array is disconnected from the cell array by turning off a MOS transistor included in a connection block. Herein, a bit line pair of the disconnected cell array has a voltage level of about half of VDD; and one bit line and the other bit line of the sense amplifier have a voltage level of the supply voltage VDD and a voltage level of the ground GND respectively.

Accordingly, even though the connection block is turned off, the bleed current is flown from the disconnected cell array to the sense amplifier ("Sub_Vt Leak Current" shown in FIG. 4. This bleed current causes a current increase during a data access operation.

SUMMARY OF THE INVENTION

It is, therefore, an object of the present invention to provide a semiconductor memory device for improving an operational speed not using a high voltage under a low power supply voltage condition and for improving an operational margin at a read/write operation under the low power supply voltage condition.

In accordance with an aspect of the present invention, there is provided a semiconductor memory device, including: a read amplifying unit for transferring a data from a local data line pair to a global data line as a read data; a write driver for transferring a write data from the global data line to the local data line pair; and an input/output (I/O) switching unit for transferring the read data from a segment data line pair to the local data line pair and for transferring the write data from the local data line pair to the segment data line pair, wherein each of the local data line pair and the segment line pair includes a VDD precharge block.

In accordance with another aspect of the present invention, there is provided a method for operating a semiconductor memory device provided with a power supply voltage and a ground voltage, including the steps of: a) inputting signals to a bit line and a bit line bar corresponding to a stored data; b) amplifying a higher voltage level between the bit line and the bit line bar to the power supply voltage and amplifying the lower voltage level to a low voltage which is lower than the ground voltage, and latching the amplified signals; c) transferring the signal having the power supply voltage level and the signal having the low voltage level through a first and a second data lines; and d) outputting a data corresponded to the transferred signal to the outside of the semiconductor memory device.

In accordance with further another aspect of the present invention, there is provided a method for operating a semiconductor memory device provided with a power supply voltage and a ground voltage, including the steps of: a) inputting signals to a bit line and a bit line bar corresponding to a stored data; b) amplifying a higher voltage level between the bit line and the bit line bar to the power supply voltage and amplifying the lower voltage level to a low voltage which is lower than the ground voltage, and latching the amplified signals; c) receiving a data corresponding to a write command; d) delivering a first signal having the power supply voltage level and a second signal having a low voltage level which is lower than the ground voltage to a first and a second data lines, wherein the first and the second signals correspond to the data; e) replacing the latched signals with the first and the second signals; and f) storing a data corresponded to the first and the second signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
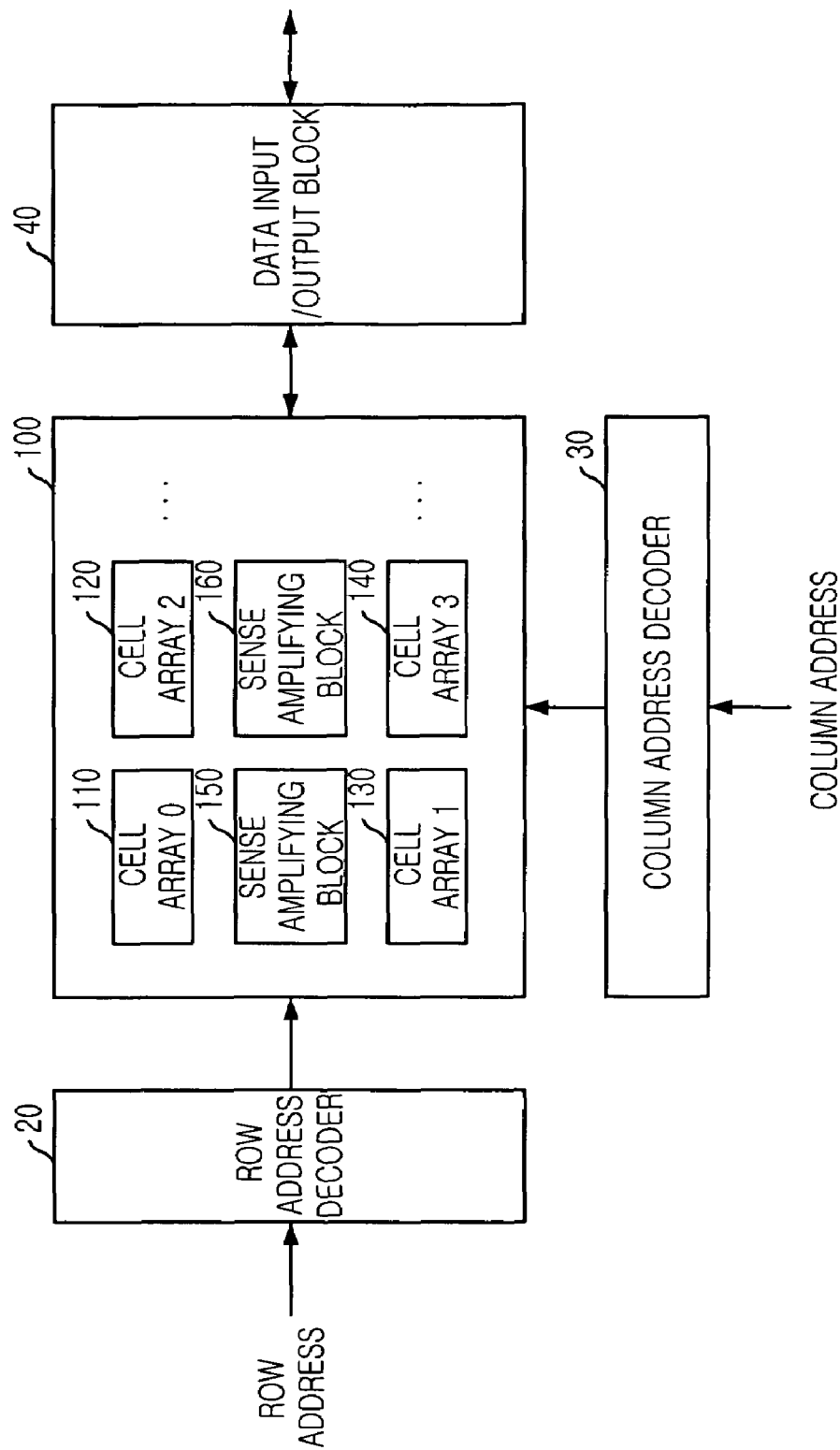
FIG. 1 is a block diagram showing a core area of a conventional semiconductor memory device.
Figure 2:
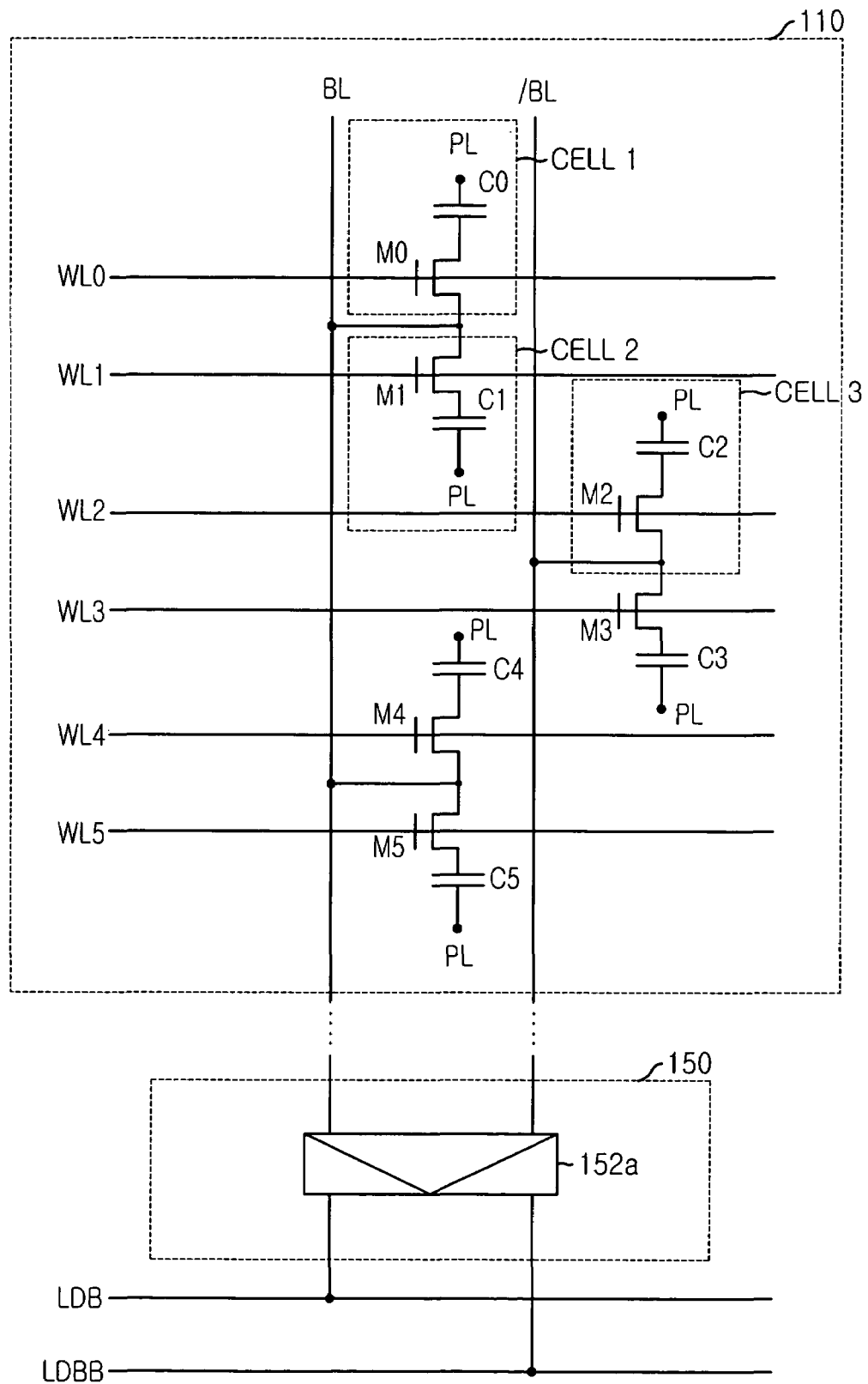
FIG. 2 is a block diagram depicting a detailed structure of the cell area shown in FIG. 1.
Figure 3:
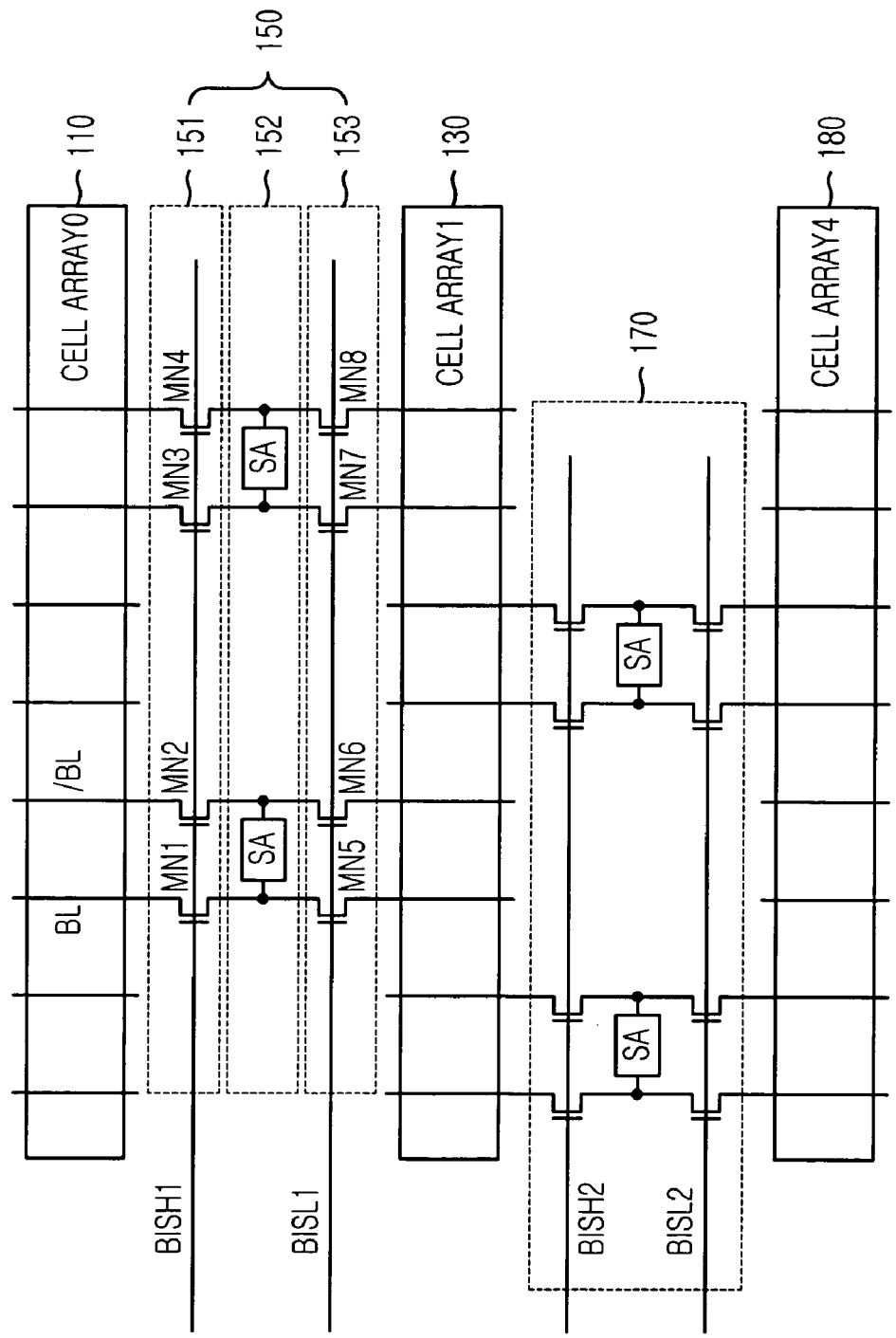
FIG. 3 is a block diagram describing a connection between each cell array and each sense amplifying block included in the cell area shown in FIG. 1.
Figure 4:
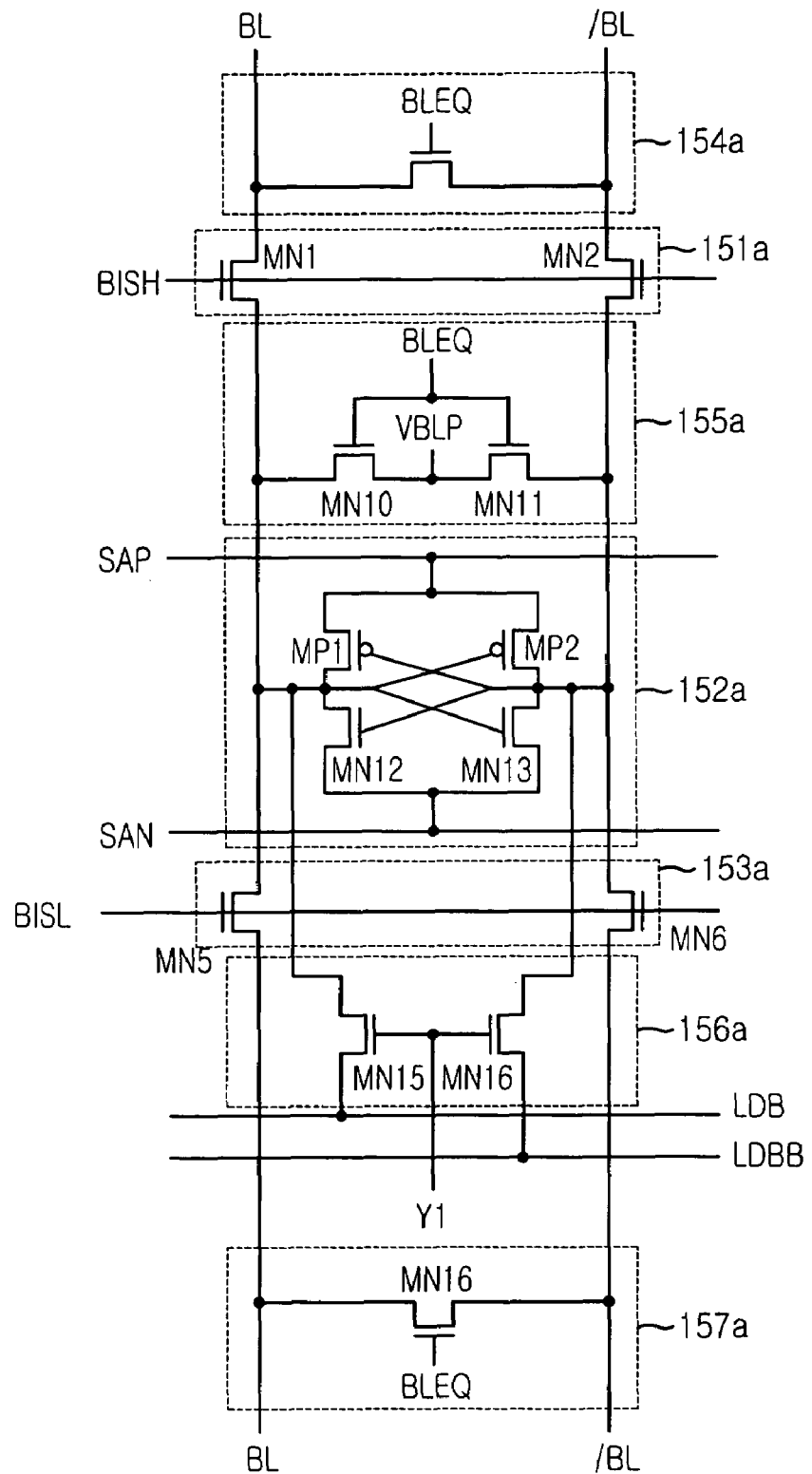
FIG. 4 is a block diagram depicting the sense amplifying block shown in FIG. 2.
Figure 5:
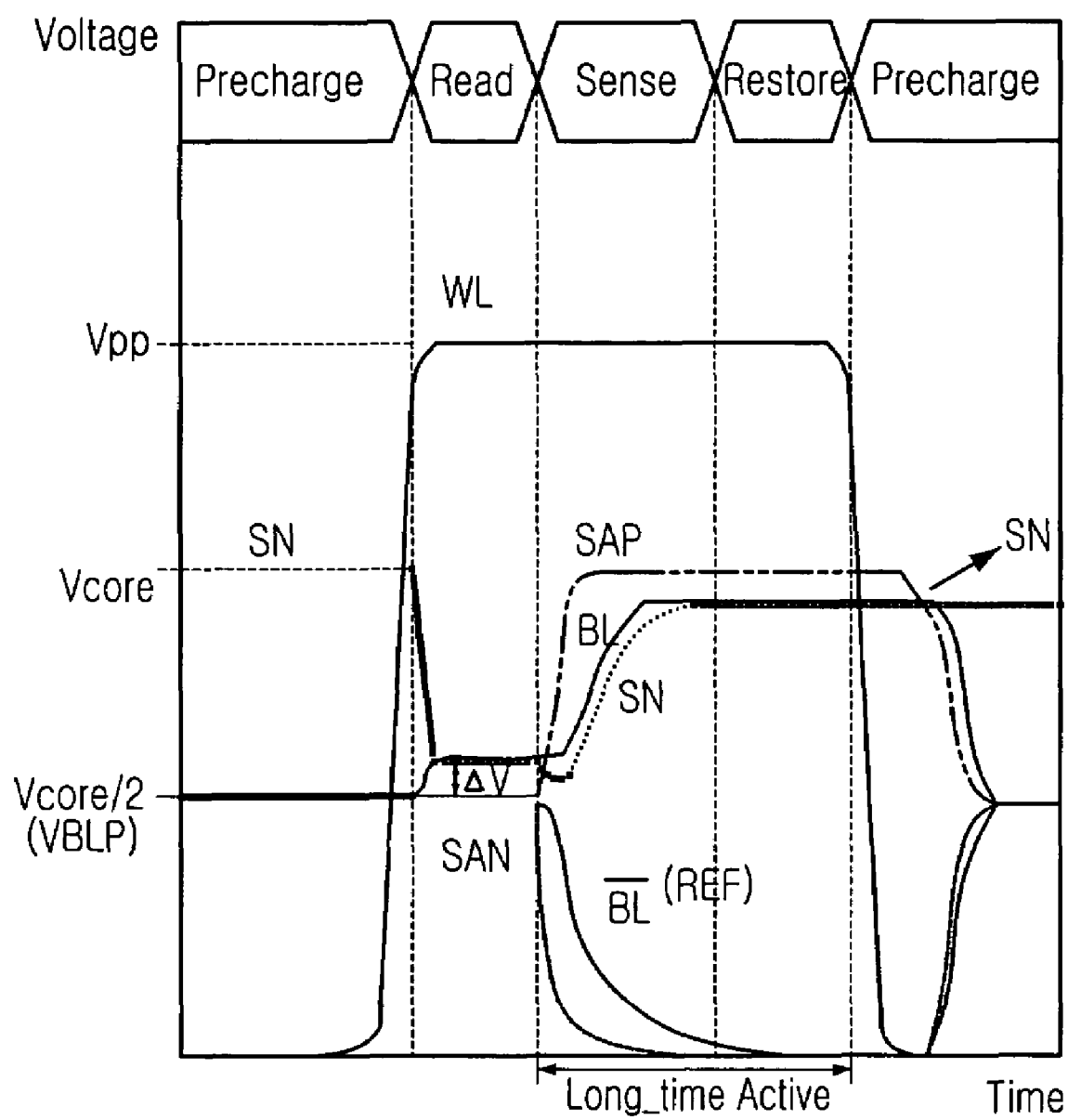
FIG. 5 is a waveform showing an operation of the conventional semiconductor memory device.
Figure 6:
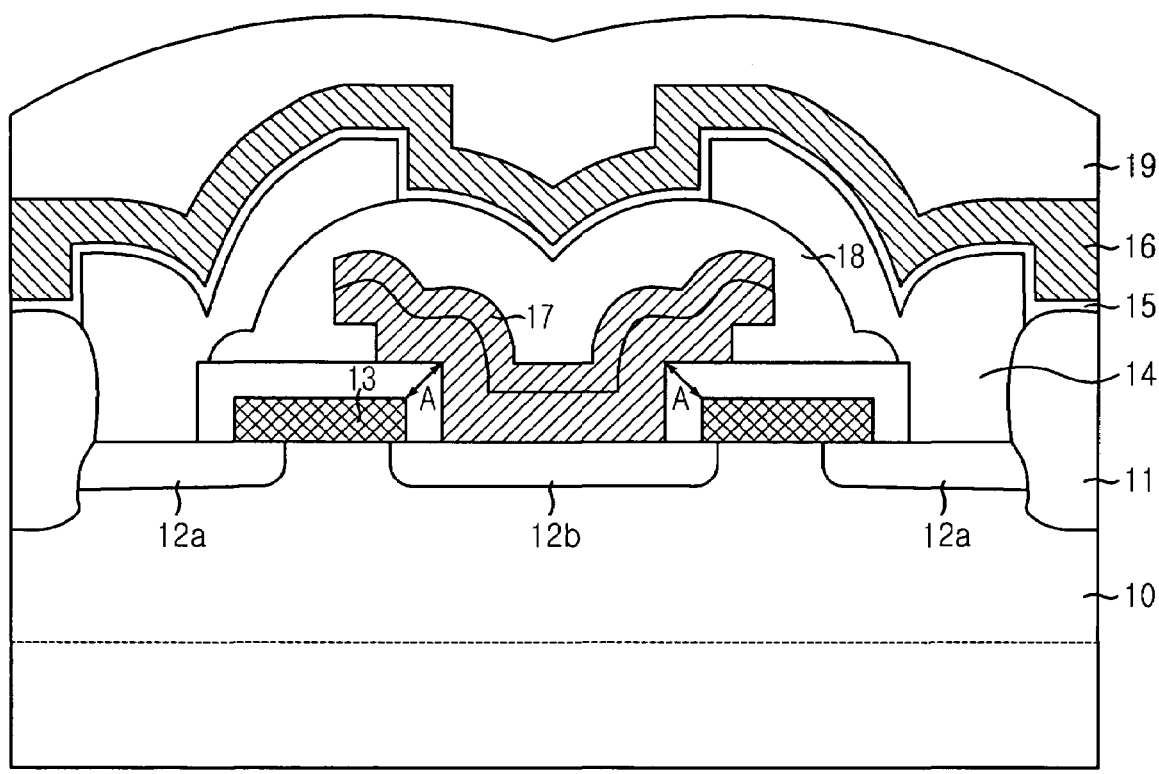
FIG. 6 is a cross-sectional view describing a unit cell of the semiconductor memory device in order to show a cause of the bleed current.
Figure 7:
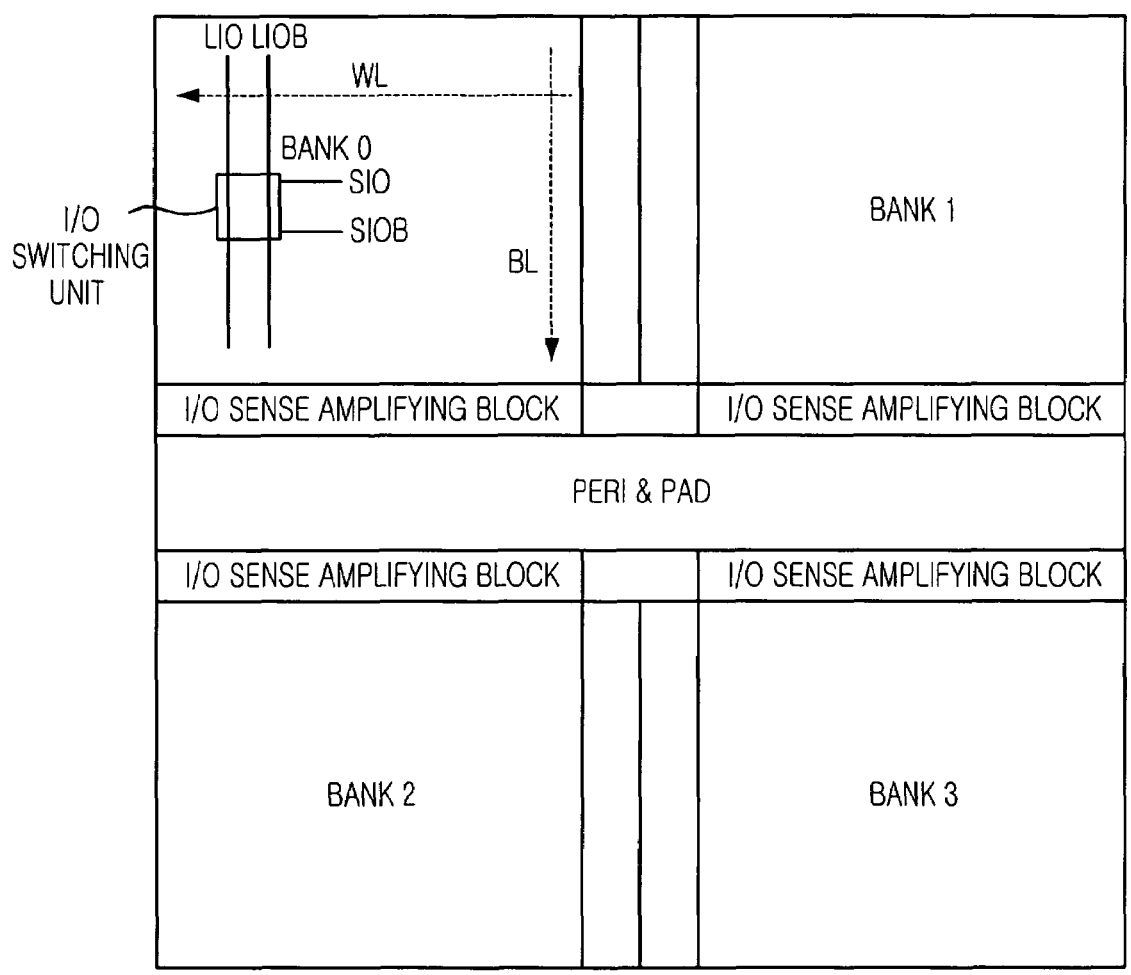
FIG. 7 is a block diagram showing a semiconductor memory device in accordance with an embodiment of the present invention.

FIG. 7 is a block diagram showing a semiconductor memory device in accordance with an embodiment of the present invention.

As shown, the semiconductor memory device includes a plurality of banks and each bank includes an X-decoder for receiving and decoding an X-address to thereby select a word line; an input/output (I/O) sense amplifying block for sensing and amplifying a data transferred by a selected bit line and for outputting the amplified data; and a Y-decoder for decoding a Y-address to thereby select a bit line.

Each bank further includes an input/output (I/O) switching unit for delivering a data transferred by a bit line to the I/O switching unit. The number of I/O switching units included in each bank corresponds to the number of first local data line pair SIO and SIOB.

Generally, the number of units cells included in the semiconductor memory device is maximized for storing more data, and a data signal strength stored in a unit cell is minimized. Accordingly, a data stored in a unit cell should be amplified in order to stably access the data. That is, a data stored in a unit cell is sense amplified by stages and a data line is provided in each stage for transferring an amplified data.

In detail, the semiconductor memory device includes a bit line sense amplifier and an I/O sense amplifier for outputting a data stored in a unit cell. If a data signal stored in a unit cell is delivered to a bit line, the data signal is sensed and amplified by the bit line sense amplifier. That is, the bit line sense amplifier senses and amplifies a potential difference between the bit line having the data signal and the other bit line having a reference signal.

Then, the data signal sensed and amplified by the sense amplifier is transferred to the first local data line pair SIO and SIOB, and the I/O switching unit delivers the transferred data to a second local data line pair LIO and LIOB. After that, a sense amplifier included in the I/O sense amplifying block senses and amplifies the data signal delivered to the second local data line pair LIO and LIOB in order to output the amplified data signal to a global data line. The data signal outputted to the global data line is outputted to an outside of the semiconductor memory device through a data input/output buffer.

Figure 8:
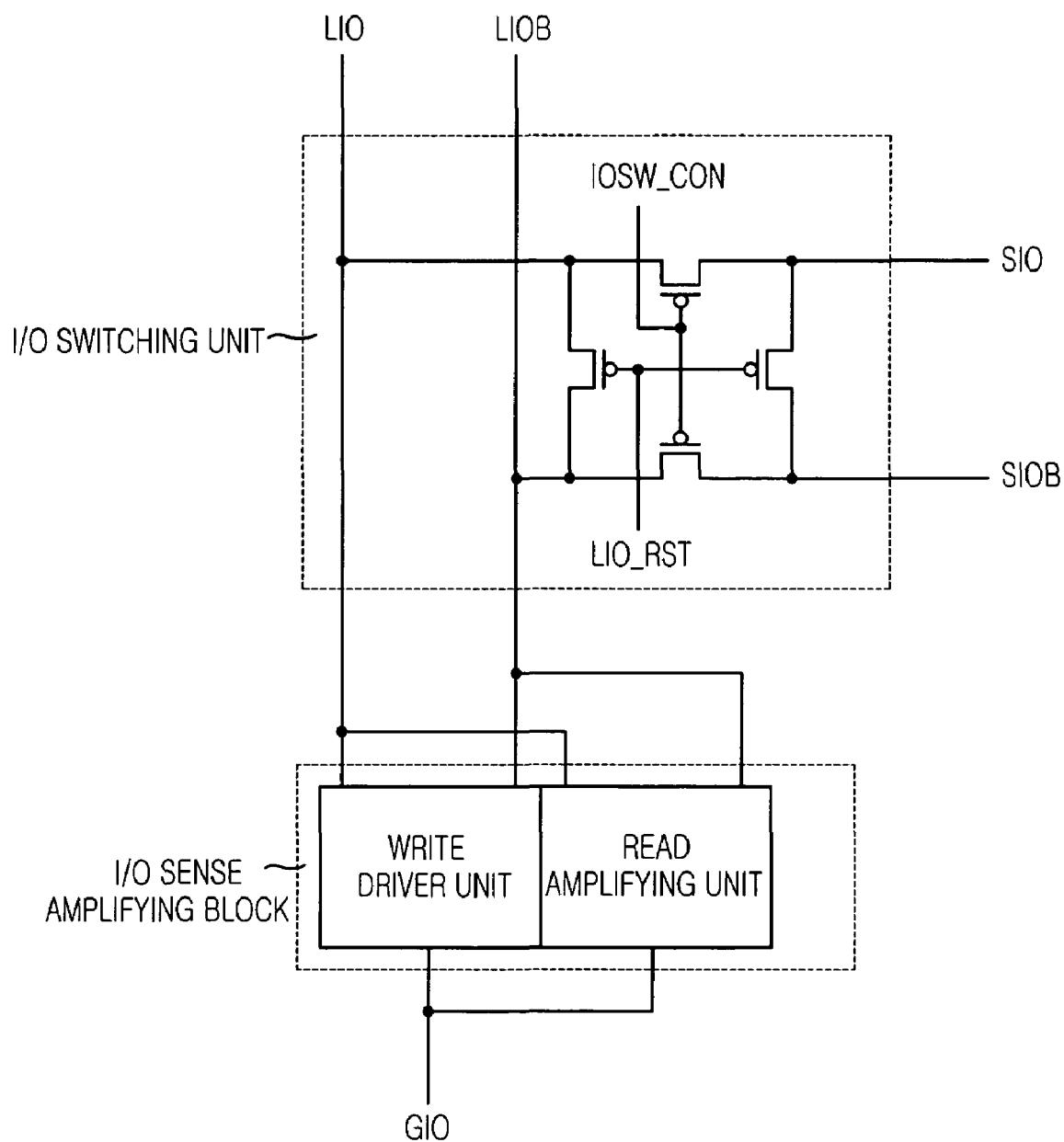
FIG. 8 is a schematic circuit diagram depicting the I/O switching unit shown in FIG. 7.

FIG. 8 is a schematic circuit diagram depicting the I/O switching unit shown in FIG. 7.

As shown, the I/O switching unit includes two p-type metal oxide semiconductor (PMOS) transistors for transferring a data loaded on the first local data line pair SIO and SIOB to the second local data line pair LIO and LIOB in response to a first control signal IOSW_CON; and other two PMOS transistors for equalizing a voltage level of the first local data line pair SIO and SIOB and a voltage level of the second local data line pair LIO and LIOB.

Herein, as above-mentioned, a plurality of I/O switching units are included in each bank and the number of the plurality of I/O switching units is determined by the number of first local data line pairs included in each bank.

Meanwhile, the I/O sense amplifying block includes a read amplifying unit for sensing and amplifying a data loaded on the second local data line pair LIO and LIOB to thereby output the amplified data to a global bit line GIO; and a write driver unit for delivering a data inputted from an outside of the semiconductor memory device through the global bit line GIO to the second local data line pair LIO and LIOB.

A data input/output buffer unit is included between the global bit line GIO and a data input/output pad for delivering a data inputted through the data input/output pad to the global bit line GIO and for delivering a data loaded on the global bit line GIO to the data input/output pad in order to output the data to the outside of the semiconductor memory device.

Although it is not described in FIG. 8, the I/O switching unit further including VDD precharge blocks for the first local data line pair SIO and SIOB and the second local data line pair LIO and LIOB.

Figure 9:
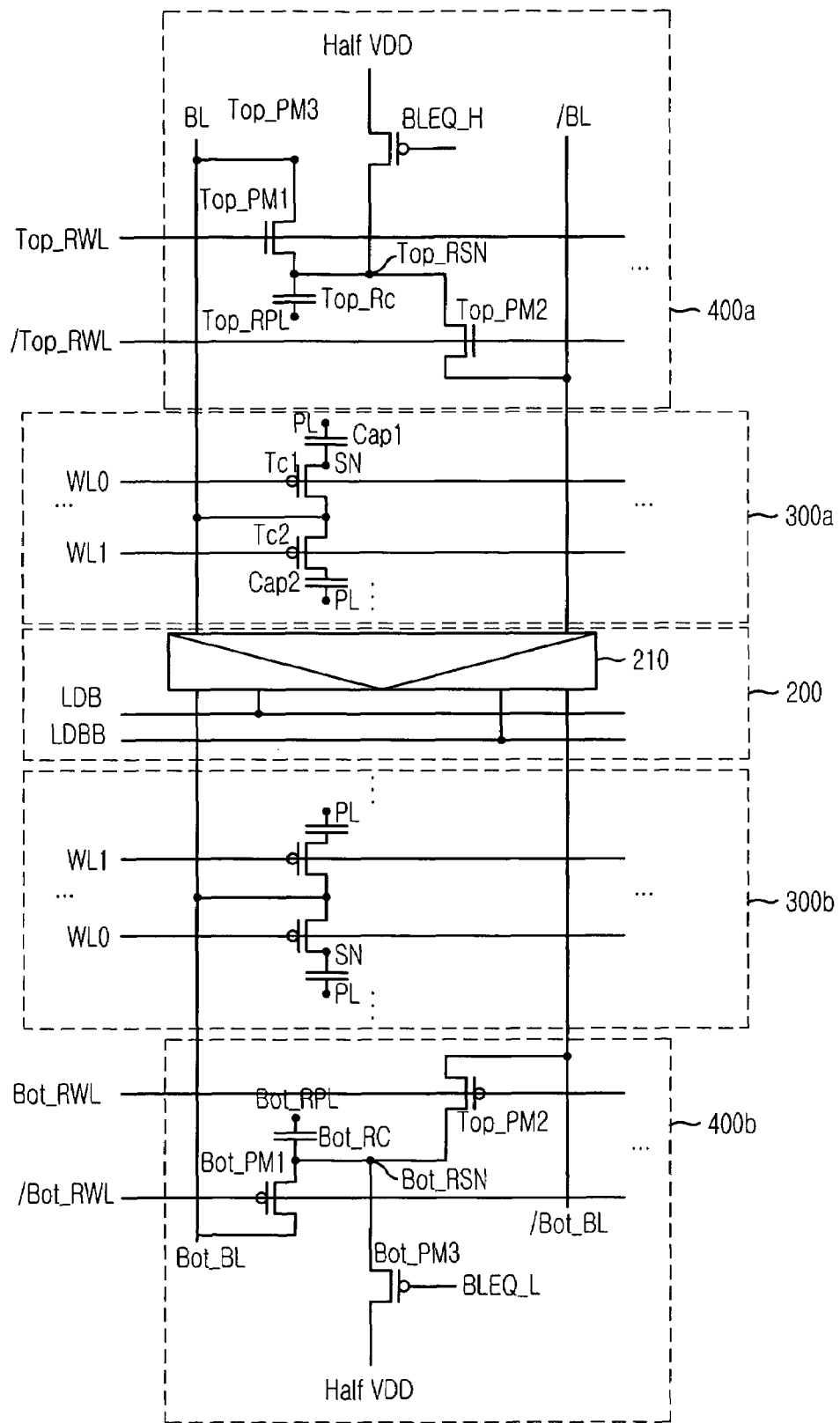
FIG. 9 is a block diagram for depicting a semiconductor memory device in accordance with an embodiment of the present invention in detail.
Figure 10:
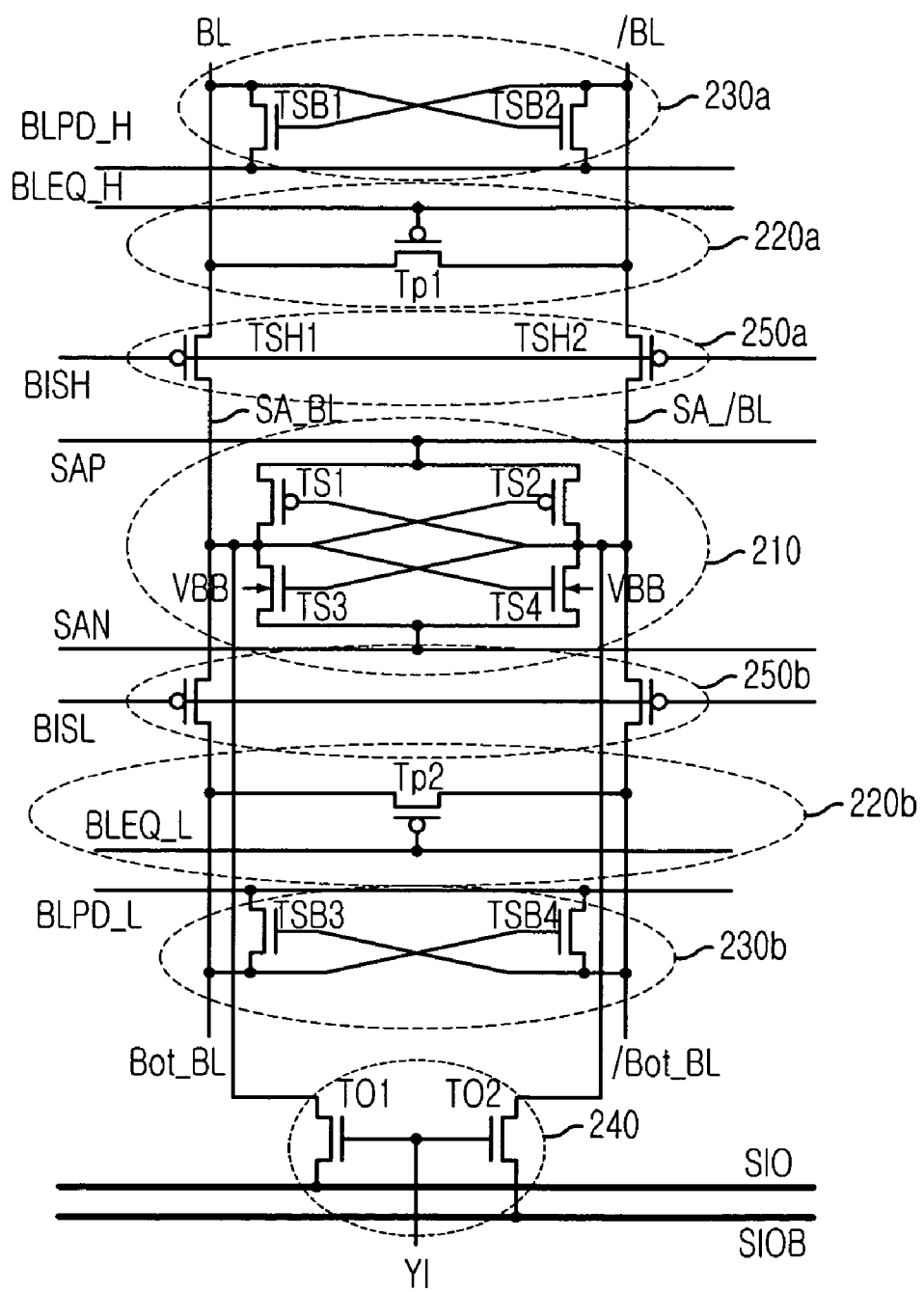
FIG. 10 is a schematic circuit diagram depicting a sense amplifying block shown in FIG. 9.

FIG. 9 is a block diagram for depicting the semiconductor memory device in detail. FIG. 10 is a schematic circuit diagram depicting a sense amplifying block shown in FIG. 9.

The semiconductor memory device in accordance with the present invention receives a power supply voltage VDD and a ground voltage VSS for operating and includes a plurality of unit cells each having a MOS transistor and a capacitor.

In detail, the semiconductor memory device includes a first cell array 300a for storing data and for outputting a data signal to a first bit line BL or a first bit line bar /BL; a sense amplifying block 200 having a bit line sense amplifier 210 for sensing and amplifying the data signal loaded on one of the first bit line BL and the first bit line bar /BL by amplifying a potential difference between the first bit line BL and the first bit line bar /BL; and a first reference cell block 400a for transferring a reference signal to the first bit line bar /BL when the data signal is outputted to the first bit line BL or to the first bit line BL when the data signal is outputted to the first bit line bar /BL.

The sense amplifying block 200 further includes a first precharge unit 220a for equalizing a potential difference between the first bit line BL and the first bit line bar /BL coupled to the first cell array 300a at a precharge operation. That is, the first precharge unit 220a floats the first bit line BL and the first bit line bar /BL not proving a precharge voltage to the first bit line BL and the first bit line bar /BL at the precharge operation. Herein, the first precharge unit 220a includes a first PMOS transistor Tp1 for connecting the first bit line BL to the first bit line bar /BL at the precharge operation.

The first reference cell block 400a includes a reference capacitor Top_RC whose one terminal is coupled to a reference power supply terminal Top_RPL; a first reference switching PMOS transistor Top_PM1 for connecting the other terminal of the reference capacitor Top_RC to the first bit line BL when a data signal is delivered to the first bit line bar /BL; and a second reference switching PMOS transistor Top_PM2 for connecting the other terminal of the reference capacitor Top_RC to the first bit line bar /BL when a data signal is delivered to the first bit line BL.

Herein, a capacitance of the reference capacitor Top_RC is substantially same to that of a unit cell capacitor, e.g., Cap1, included in the first cell array 300a. A voltage level at the reference power supply terminal Top_RPL is one of the ground voltage VSS, a half of the power supply voltage VDD and the power supply voltage VDD.

The number of reference capacitors included in the first reference cell block 400a corresponds to the number of bit line pairs included in a corresponding cell array, i.e., the first cell array 300a. For instance, if the first cell array 300a includes 256 bit line pairs, the first reference cell block 400a includes 256 reference capacitors. Each reference capacitor is coupled to one of a corresponding bit line pair which carries no data signal to thereby deliver a reference signal stored in the reference capacitor to the coupled bit line.

Meanwhile, the sense amplifying block 200 further includes a first connection unit 250a connected between the bit line sense amplifier 210 and the first precharge unit 220a for connecting/disconnecting the first bit line BL and the first bit line bar /BL included in the first cell array 300a to/from the bit line sense amplifier 210.

The first connection unit 250a includes a second PMOS transistor TBH1 for connecting the bit line BL to the bit line sense amplifier 210 in response to a first connection control signal BISH; and a third PMOS transistor TBH2 for connecting the bit line bar /BL to the bit line sense amplifier 210 in response to the first connection control signal BISH.

Also, the sense amplifying block 200 further includes a first auxiliary bit line sense amplifier 230a for amplifying and maintaining a voltage level of one of the first bit line BL and the first bit line bar /BL included between the first cell array 300a and the first connection unit 250a, which has a smaller voltage level than the other, as a voltage level of the ground voltage VSS. A signal BLEQ_H inputted to the first auxiliary bit line sense amplifier 230a has a voltage level of the ground voltage VSS while the bit line sense amplifier is operated.

In detail, the first auxiliary bit line sense amplifier 230a includes a first auxiliary MOS transistor TSB1 and a second auxiliary MOS transistor TSB2.

One terminal of the first auxiliary MOS transistor TSB1 receives a signal BLPD_H which is activated when the bit line sense amplifier 210 is enabled and the other terminal is coupled to the first bit line BL connected between the first cell array 300a and the first connection unit 250a. A gate of the first auxiliary MOS transistor TSB1 is coupled to the first bit line bar /BL connected between the first cell array 300a and the first connection unit 250a. Similarly, one terminal of the second auxiliary MOS transistor TSB2 receives the signal BLPD_H which is activated when the bit line sense amplifier 210 is enabled and the other terminal is coupled to the first bit line bar /BL connected between the first cell array 300a and the first connection unit 250a. A gate of the second auxiliary MOS transistor TSB2 is coupled to the first bit line BL connected between the first cell array 300a and the first connection unit 250a.

Meanwhile, in accordance with the preferred embodiment, a cell array has a folded structure and also has a shared structure, i.e., a bit line sense amplifier is commonly coupled two neighboring cell arrays. Therefore, the semiconductor memory device further includes a second cell array 300b coupled to the other side of the bit line sense amplifier 210; and a second connection unit 250b for connecting/disconnecting the second cell array 300b to/from bit line sense amplifier 210.

Similar to the first cell array 300a, the second cell array 300b stores data and outputs a data signal to a selected second bit line Bot_BL or a second bit line bar /Bot_BL. The second connection unit 250b connects/disconnect the second bit line Bot_BL and the second bit line bar /Bot_BL to/from the bit line sense amplifier 210.

Herein, the semiconductor memory device further includes a second reference cell block 400b for transferring a reference signal to the second bit line bar /Bot_BL when the data signal is outputted to the second bit line Bot_BL or to the second bit line Bot_BL when the data signal is outputted to the second bit line bar /Bot_BL; and a second precharge unit 220b for equalizing a potential difference between the second bit line Bot_BL and the second bit line bar /Bot_BL included in the second cell array 300b at the precharge operation. That is, the second precharge unit 220b floats the second bit line Bot_BL and the second bit line bar /Bot_BL not proving a precharge voltage to the second bit line Bot_BL and the second bit line bar /Bot_BL at the precharge operation. Herein, the second precharge unit 220b includes a fourth PMOS transistor Tp2 for connecting the second bit line Bot_BL to the second bit line bar /Bot_BL at the precharge operation.

Meanwhile, the sense amplifying block 200 further includes a second auxiliary bit line sense amplifier 230b connected between the second cell array 300b and the bit line sense amplifier 210 for amplifying and maintaining a voltage level of one of the second bit line Bot_BL and the second bit line bar /Bot_BL included between the second cell array 300b and the second connection unit 250b, which has a smaller voltage level than the other, as a voltage level of the ground voltage VSS.

In detail, the second auxiliary bit line sense amplifier 230b includes a first auxiliary NMOS transistor TSB3 and a second auxiliary NMOS transistor TSB4.

One terminal of the first auxiliary NMOS transistor TSB3 receives a signal BLPD_L which is activated when the bit line sense amplifier 210 is enabled and the other terminal is coupled to the second bit line Bot_BL connected between the second cell array 300b and the second connection unit 250b. A gate of the first auxiliary NMOS transistor TSB3 is coupled to the second bit line bar /Bot_BL connected between the second cell array 300b and the second connection unit 250b. Similarly, one terminal of the second auxiliary NMOS transistor TSB4 receives the signal BLPD_L which is activated when the bit line sense amplifier 210 is enabled and the other terminal is coupled to the second bit line bar /Bot_BL connected between the second cell array 300b and the second connection unit 250b. A gate of the second auxiliary NMOS transistor TSB4 is coupled to the second bit line Bot_BL connected between the second cell array 300b and the second connection unit 250b.

Meanwhile, the bit line sense amplifier 210 includes a first and a second sense amplifying PMOS transistors TS1 and TS2 and a first and a second sense amplifying NMOS transistors TS3 and TS4.

A gate of the first sense amplifying PMOS transistor TS1 is connected to the first bit line bar /BL by the first connection unit 250a or to the second bit line bar /Bot_BL by the second connection unit 250b. One terminal of the first sense amplifying PMOS transistor TS1 receives the power supply voltage VDD and the other terminal is connected to the first bit line BL by the first connection unit 250a or to the second bit line Bot_BL by the second connection unit 250b.

Similarly, a gate of the second sense amplifying PMOS transistor TS2 is connected to the first bit line BL by the first connection unit 250a or to the second bit line Bot_BL by the second connection unit 250b. One terminal of the second sense amplifying PMOS transistor TS2 receives the power supply voltage VDD and the other terminal is connected to the first bit line bar /BL by the first connection unit 250a or to the second bit line bar /Bot_BL by the second connection unit 250b.

A gate of the first sense amplifying NMOS transistor TS3 is connected to the first bit line bar /BL by the first connection unit 250a or to the second bit line bar /Bot_BL by the second connection unit 250b. One terminal of the first sense amplifying NMOS transistor TS3 receives a first low voltage VBB and the other terminal is connected to the first bit line BL by the first connection unit 250a or to the second bit line Bot_BL by the second connection unit 250b.

Similarly, a gate of the second sense amplifying NMOS transistor TS4 is connected to the first bit line BL by the first connection unit 250a or to the second bit line Bot_BL by the second connection unit 250b. One terminal of the second sense amplifying NMOS transistor TS4 receives the first low voltage VBB and the other terminal is connected to the first bit line bar /BL by the first connection unit 250a or to the second bit line bar /Bot_BL by the second connection unit 250b.

Herein, the first low voltage VBB has a lower voltage level than the ground voltage VSS having a voltage level of about −0.5V. The bit line sense amplifier 210 performs a sensing and amplifying operation by using the first low voltage VBB and the power supply voltage VDD.

Meanwhile, a PMOS transistor included in a unit cell, e.g., TC1, is turned on in response to a second low voltage VBBW which is lower than the first low voltage VBB having a voltage level of about −2.0V. A selected unit cell included in the first cell array 300a is activated by turning on a PMOS transistor included in the selected unit cell by using the second low voltage VBBW and the selected unit cell is inactivated by turning off the PMOS transistor by using the power supply voltage VDD.

Meanwhile, the semiconductor memory device further includes a data input/output unit 240 for outputting a data sensed and amplified by the bit line sense amplifier 210 through a data line (LDB, LDBB) and for delivering a data inputted from the data line to the bit line sense amplifier 210.

In detail, the data input/output unit 240 includes a first and a second input/output MOS transistors TO1 and TO2. A gate of the first input/output MOS transistor TO1 receives an input/output control signal. One terminal of the first input/output MOS transistor TO1 is connected to the first and the second bit lines BL and Bot_BL and the other terminal of the first input/output MOS transistor TO1 is coupled to a first data line LDB. Similarly, a gate of the second input/output MOS transistor TO2 receives the input/output control signal; and one terminal of the second input/output MOS transistor TO2 is connected to the first and the second bit line bars /BL and /Bot_BL and the other terminal of the second input/output MOS transistor TO2 is coupled to a second data line LDBB.

Figure 11:
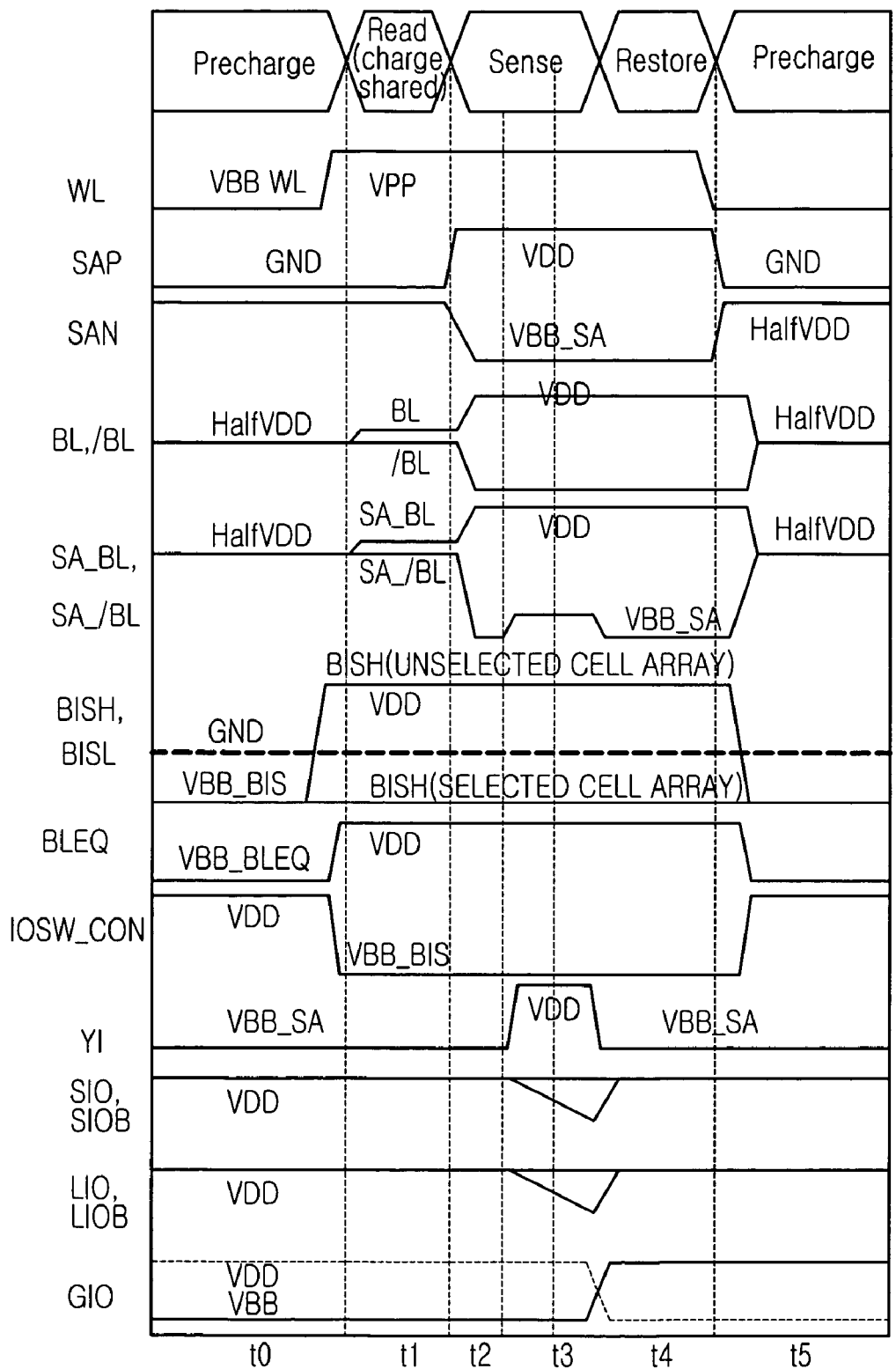
FIG. 11 is a timing diagram showing an operation of a semiconductor memory device in accordance with an embodiment of the present invention when the semiconductor memory device performs a read operation.
Figure 12:
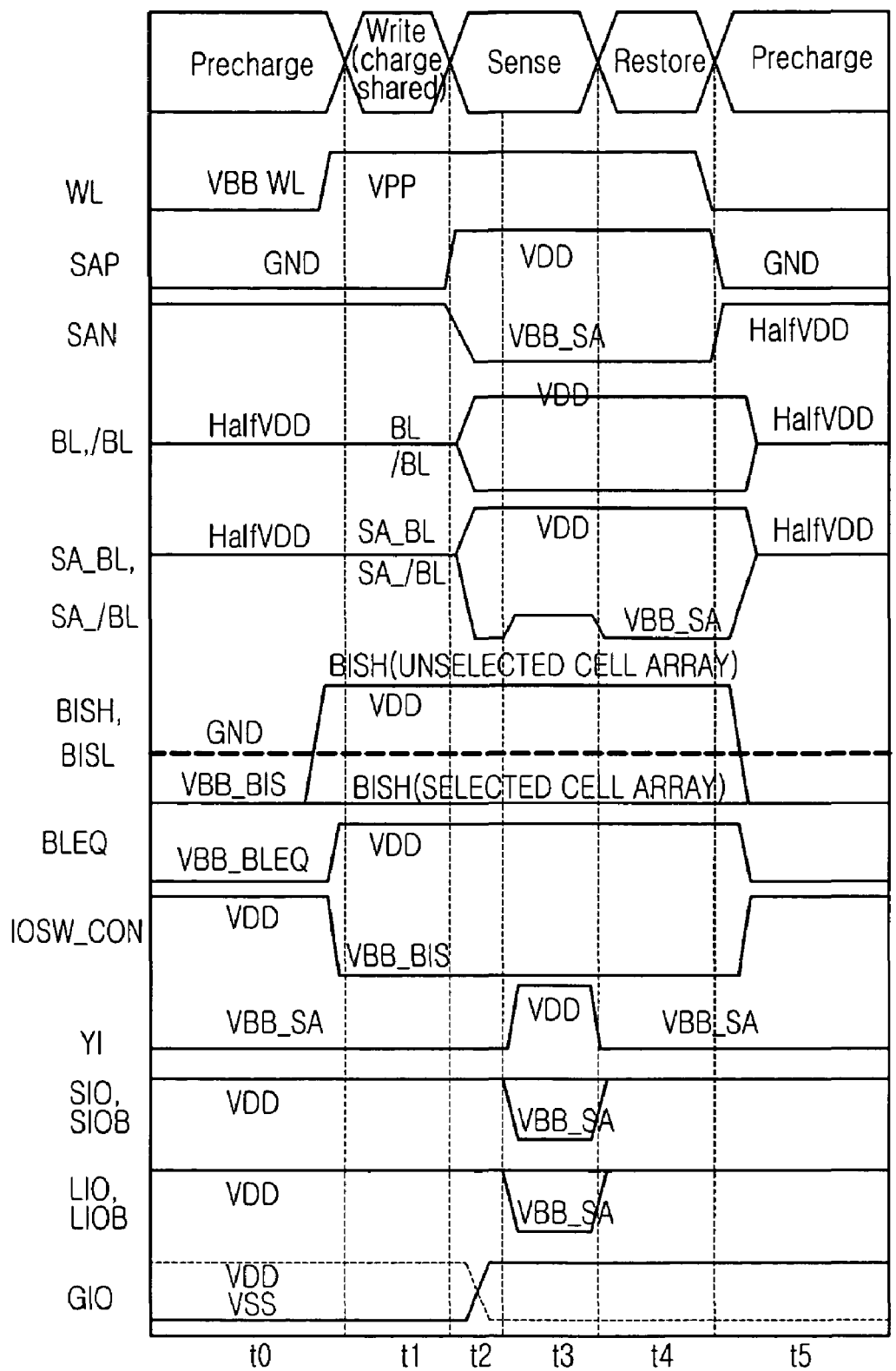
FIG. 12 is a timing diagram showing an operation of a semiconductor memory device in accordance with the present invention when the semiconductor memory device performs a write operation.

FIG. 11 is a timing diagram showing an operation of the semiconductor memory device when the semiconductor memory device performs a read operation, and FIG. 12 is a timing diagram showing an operation of the semiconductor memory device when the semiconductor memory device performs a write operation.

Referring to FIGS. 7 to 12, the operations of the semiconductor memory device are described below.

In accordance with the preferred embodiment of the present invention, a high-level data is processed by using a voltage level of a power supply voltage and a low-level data is processed by using a voltage level which is lower than a ground voltage. For this, the bit line sense amplifier senses a difference between two signals inputted to a bit line pair and amplifies a bit line having a higher signal level to a voltage level of the power supply voltage VDD and amplifies the other bit line having a lower signal level to a voltage level of the low voltage VBB. Also, a data line for transferring a data signal delivers a high-level data as a voltage level of the power supply voltage and delivers a low-level data as a voltage level of the low voltage.

Herein, the low voltage VBB can have a single voltage level or two or more different voltage levels. In accordance with the present invention, the low voltage VBB has broadly two voltage levels: one is a low voltage VBB_SA for transferring, sensing and amplifying a data signal and the other is a low voltage VBB_BIS for activating the first control signal IOSW_CON. It is preferred that the low voltage VBB_BIS is lower than the other so that a data signal is effectively transferred when the data signal is transferred through a PMOS transistor included in the I/O switching unit.

As above-mentioned, the bit line sense amplifier performs a sensing and amplifying operation by using the power supply voltage VDD and the low voltage VBB which is lower than the ground voltage GND. Therefore, the I/O switching unit includes a PMOS transistor controlled by the low voltage VBB_BIS for effectively transferring a high-level data amplified to a voltage level of the power supply voltage VDD and a low-level data amplified to a voltage level of the low voltage VBB_SA. That is, according to characteristics of a PMOS transistor, the PMOS transistor transfers a high-level data relatively very well in comparison with a low-level data. For overcoming this problem, a low voltage which is lower than the ground voltage GND is used.

Meanwhile, the semiconductor memory device floats a bit line and a bit line bar by not providing a precharge voltage to the bit line and the bit line bar at the precharge operation. For this operation, a reference cell bock is included.

Meanwhile, if a voltage level of the power supply voltage is more decreased, it is possible that an absolute quantity of the power supply voltage VDD is equal to that of the low voltage VBB. In this case, a precharge voltage level of a bit line is maintained as the ground voltage VSS if voltage levels of two bit lines are maintained same after a sensing operation of the bit line sense amplifier.

When the bit line sense amplifier senses and amplifies a bit line pair coupled to one side of the bit line sense amplifier, the other bit line pair coupled to the other side of the bit line sense amplifier maintains a precharge voltage by using a corresponding reference cell block. Accordingly, a voltage variation of a bit line is prevented and, thus, the sensing and amplifying operation can be stably performed.

Meanwhile, as above-mentioned, the semiconductor memory device includes an auxiliary bit line sense amplifier for maintaining a voltage level of a neighboring bit line pair as a half of VDD by using a reference cell block and a precharge unit when the bit line sense amplifier is operated for a data access.

Hereinafter, the above-mentioned operations of the semiconductor memory device are described in detail. Herein, it is assumed that a read operation is performed for reading a high-level data '1', and the data is transferred to the first bit line BL.

A data access operation of the semiconductor memory device can be split into four steps: a precharge step, a read/write step, a sense step and a restore step.

At the precharge step, precharge signals BLEQ_H and BLEQ_L are activated and, thus, voltage levels of the first bit line BL and the first bit line bar /BL are equalized and voltage levels of a first bit line Top_BL and a first bit line bar /Top_BL are also equalized.

As above-mentioned, since a particular precharge voltage is not provided at the precharge step, bit line pairs BL and /BL, SA_BL and SA_/BL and Bot_BL and /Bot_BL are floated (t0). At this time, the first and the second connection units 250a and 250b are turned on.

Therefore, the bit line pairs BL and /BL, SA_BL and SA_/BL and Bot_BL and /Bot_BL keep a voltage level of about half of the power supply voltage VDD at the precharge step by using enabled precharge units 220a and 220b right after a read/write operation is performed (After a sensing and amplifying operation is performed by the bit line sense amplifier, one of a bit line pair has a voltage level of the power supply voltage VDD and the other has a voltage level of the ground voltage GND). Thereafter, since a particular precharge voltage is not provided, the bit line voltage level of half of the power supply voltage VDD is decreased if a period of the precharge step is longer. If the precharge step is more continuously performed not entering the read step, the voltage level of the bit line pairs BL and /BL and SA_BL and SA_/BL is decreased to the ground voltage GND.

Therefore, a precharge voltage of a floated bit line has a variable voltage level between the half of the power supply voltage VDD and the ground voltage GND. As a result, a timing of performing the read step determines the precharge voltage of the floated bit line.

Thereafter, at the read step, a single word line is selected by decoding an inputted address. All the MOS transistors corresponding to the selected word line are turned on and a data stored in a capacitor is transferred to the bit line BL through a turned-on MOS transistor.

If the data, i.e., '1', is delivered to the bit line BL, voltage levels of the bit lines BL and SA_BL, which have a voltage level between the half of the power supply voltage VDD and the ground voltage GND as above-mentioned, are increased by an amount of a signal level of the data.

Meanwhile, a reference signal is inputted to the bit lines /BL and SA_/BL which have no data signal. A reference word line /Top_RWL having no data signal is activated and, thus, a reference MOS transistor Top_NM1 is turned on. Accordingly, the reference signal stored in the reference capacitor Top_RC is transferred to the bit lines /BL and SA_/BL and, thus, voltage levels of the bit lines /BL and SA_/BL are increased by an amount of a predetermined voltage level. At this time, similar to the bit lines BL and SA_BL, voltage levels of the bit lines /BL and SA_/BL is decreased from the half of the power supply voltage before the input of the reference signal and, then, voltage levels of the bit lines /BL and SA_/BL are increased by an amount of a signal level of the reference signal.

As above-mentioned, a capacitance of the reference capacitor Top_RC is substantially same to that of a unit cell capacitor Cap. A charge amount of the reference capacitor Top_RC which stores the reference signal is half of a charge amount of the unit cell capacitor Cap which stores the data '1'. That is, reference power supply terminals, i.e., Half VDD, Top_RPL and Bot_RPL, receive a voltage level of VDD/2, a charge amount of the reference capacitor Top_RC which stores the reference signal is half of a charge amount of the unit cell capacitor Cap which stores the data '1'. At this time, a voltage level supplied by the reference power supply terminals Top_RPL and Bot_RPL is same to a voltage level of a plate voltage PL of a unit cell capacitor included in a cell array. At this time, the voltage level can have a voltage level of VDD, VDD/2 or GND. A voltage level which is same to the plate voltage PL is supplied to a reference signal power supply terminal VCP so that the reference signal can have a half signal level of the data signal.

Accordingly, a signal level increase of the bit line bar /BL which receives the reference signal is half of that of the bit line BL which receives the data signal. For instance, when the power supply voltage is 1.0V and there is a voltage increase by 0.2V due to the data signal, the bit lines BL and /BL have a voltage level of about 0.5V at an initial state of the precharge step. Thereafter, as the precharge step is continued, a voltage level of the bit lines BL and /BL is decreased to about 0.3V. At this time, if a read command is performed, a voltage level of the bit line BL having the data signal is increased to about 0.5V (=0.3V+0.2V) and a voltage level of the bit line bar /BL having the reference signal is increased to 0.4V (=0.3V+0.1V).

Meanwhile, the precharge signal BLEQ_H is inputted as an activated state of the low voltage VBB in order to enable the first precharge unit 220a during the precharge step and is inputted as an inactivated state of the power supply voltage in order to disable the first precharge unit 220a during the read, sense and restore steps.

Next, at the sense step, a first sense amplifier power supply terminal SAP of the bit line sense amplifier 210 receives the power supply voltage VDD and a second sense amplifier power supply terminal SAN receives the low voltage VBB.

Therefore, the bit line sense amplifier 210 sense a voltage difference between the bit lines BL and /BL to thereby amplify a voltage level of a bit line having a higher voltage level, i.e., the bit line BL, to a voltage level of a power supply voltage VPP and amplify a voltage level of the bit line bar /BL to the ground voltage GND (t2).

Since the bit line sense amplifier 210 performs the amplifying operation by using the power supply voltage VPP and the low voltage VBB, the amplifying operation can be performed at a high speed in comparison with using the power supply voltage VDD and the ground voltage GND.

Herein, a voltage level of the bit line SA_/BL included between the bit line sense amplifier 210 and the second connection unit 250b is amplified to the negative low voltage VBB; however, the bit line /BL included between the first cell array 300a and the first connection unit 250a is amplified to the ground voltage GND. Since the first connection control signal BISH inputted to each gate of the second and the third PMOS transistors TSH1 and TSH2 included in the first connection unit 250a has a voltage level of a low voltage VBB_H, even though the bit line SA_/BL coupled to the bit line sense amplifier 210 is amplified to the low voltage, the bit line /BL coupled to the first cell array 300a is amplified to the ground voltage which is higher than the low voltage.

Accordingly, the second connection unit 250b performs a clamping operation so that a low voltage level is not transferred to the second cell array 300b even though the bit line sense amplifier 210 amplifies the bit line SA_/BL to the low voltage VBB. Also, since a parasitic capacitance is relatively smaller than a sub-threshold voltage of the second and the third PMOS transistors TSH1 and TSH2 included in the first connection unit 250a, the bit line /BL coupled to a cell array can keep a voltage level of the ground voltage GND during the sensing and amplifying operation of the bit line sense amplifier 210 and the restore step.

Therefore, since the bit lines BL and /BL coupled to a cell array can keep a voltage level of the ground voltage by preventing the low voltage VBB amplified by the bit line sense amplifier 210 from being transferred to the bit lines BL and /BL, a voltage variation of a bit line is prevented and, thus, an operational speed of the bit line sense amplifier 210 can be improved and a power consumption due to a voltage variation of a bit line coupled to a cell array can be reduced. For this, the first and the second connection units 250a and 250b are provided not only for controlling the connection between the bit line sense amplifier 210 and a cell array but also for preventing a low voltage VBB_H from being transferred to the bit lines BL, /BL, Top_BL and /Top_BL included in a cell array.

However, the first and the second connection units 250a and 250b are not enough for stably maintaining a voltage level of the bit lines BL and /BL included in a cell array as the ground voltage GND. Therefore, the first and the second auxiliary bit line sense amplifier 230a and 230b are provided for maintaining a voltage level of the bit lines BL and /BL included in a cell array as the ground voltage GND even though the bit lines SA_BL and SA_/BL coupled to the bit lines sense amplifier 210 are amplified to the negative low voltage VBB_H.

The auxiliary bit line sense amplifier, e.g., 230a, amplifies and maintains one of the bit lines BL and /BL included in the first cell array 300a, which has a lower voltage level than the other, as the ground voltage level while the bit line sense amplifier 210 performs the sensing and amplifying operation. When the bit line sense amplifier 210 amplifies a voltage level of the bit line SA_BL to the power supply voltage VDD and amplifies a voltage level of the bit line SA_/BL to the low voltage VBB, the bit line BL keeps a voltage level of the power supply voltage and the bit line bar /BL keeps a voltage level of the ground voltage GND. At this time, the auxiliary bit line sense amplifier 230a decreases a voltage level of the bit line bar /BL to the ground voltage GND when a voltage level of the bit line bar /BL is higher than the ground voltage GND and increases a voltage level of the bit line bar /BL to the ground voltage GND when a voltage level of the bit line bar /BL is lower than the ground voltage GND.

The signals BLPD_H and BLPD_L respectively inputted to the first and the second auxiliary bit line sense amplifiers 230a and 230b are activated as the ground voltage during an activation period of the bit line sense amplifier 210 (t2, t3, t4). As above-mentioned, gates of two MOS transistors included in the auxiliary bit line sense amplifier, e.g., TSB1 and TSB2, are cross-coupled to the bit lines BL and /BL and each one terminal of the MOS transistors receives the ground voltage to thereby maintain a voltage level of a lower bit line to the ground voltage.

Since a unit cell included in a cell array is constituted with an NMOS transistor and a capacitor, if low voltage VBB is transferred to the bit line included in the cell array when the bit line sense amplifier 210 amplifies a bit line pair to the power supply voltage and the low voltage VBB, an NMOS transistor in a unit cell is turned on and a data of an unselected unit cell may be lost. Therefore, it is required that a low voltage amplified by the bit line sense amplifier is not delivered to a bit line included in a cell array while the bit line sense amplifier is operated.

Meanwhile, each connection control signal inputted to the first and the second connection unit 250a and 250b has two voltage levels: one is a low voltage VBB_L having a negative voltage level whose absolute quantity is larger than a threshold voltage of a PMOS transistor included in the first and the second connection units 250a and 250b and the other is a low voltage VBB_H having a negative voltage level whose absolute quantity is equal to the threshold voltage of a PMOS transistor included in the first and the second connection units 250a and 250b.

The first and the second connection control signals BISH and BISL are inputted as the low voltage VBB_H for equalizing voltage levels of a bit line pair included in the first and the second cell arrays 300a 300b, e.g., the bit line pair BL and /BL, during the precharge step.

At the read step where first cell array 300a is connected to the bit line sense amplifier 210 and the second cell array 300b is disconnected from the bit line sense amplifier 210, the second connection control signal BISL is provided as the power supply voltage VDD to disable the second connection unit 250b and the first connection control signal BISH is activated having a voltage level of the low voltage VBB_L to enable the first connection unit 250a. Thereafter, at the sense step where the bit line sense amplifier 210 senses and amplifies a voltage difference between bit lines SA_BL and SA_/BL and the restore step, the activated first connection control signal BISH is provided as the low voltage VBB_H.

Therefore, during the sensing and amplifying operation, the relatively lower low voltage VBB_L is used for more reliable isolation between the bit line sense amplifier and a bit line coupled to a cell array and, then, the relatively higher low voltage VBB_H is used for the isolation between the bit line sense amplifier and the bit line coupled to the cell array. This is for the bit line sense amplifier to perform the sensing and amplifying operation more quickly by using the low voltage VBB_H when the bit line sense amplifier mainly performs the sensing and amplifying operation.

Thereafter, when the sensing and amplifying operation of the bit line sense amplifier 210 is completed, an input/output control signal Y1 is activated for a predetermined time. Then, in response to the input/output control signal Y1, a data signal latched by the bit line sense amplifier 210 is outputted to the first local data line pair SIO and SIOB (t3).

The first control signal IOSW_CON is activated as a voltage level of the low voltage VBB_BIS during the four steps except for the precharge step (t1 to t4). Therefore, a data transferred to the first local data line pair SIO and SIOB is delivered to the second local data line pair LIO and LIOB.

At the precharge step, the first control signal IOSW_CON is inactivated as a high level and a second control signal LIO_RST is activated to precharge each data lines, i.e., SIO, SIOB, LIO and LIOB, to a same voltage level.

The data signal transferred by the second local data line pair LIO and LIOB is sensed and amplified by the read amplifying unit to be delivered to the global data line GIO. The data signal transferred to the global data line GIO is buffered by the data input/output buffer to be outputted to the outside through the data input/output pad. Herein, the outputted data signal corresponds to a read command. A block diagram for the data input/output buffer and the data input/output pad is omitted.

Thereafter, at the restore step, the data signal is restored to an original unit cell by using the data signal latched by the bit line sense amplifier 210 (t4). When the restore step is completed, a word line WL is in activated, and the first and the second sense amplifier power supply terminals SAP and SAN are respectively supplied with the ground voltage GND and a half of the power supply voltage VDD so that the bit line sense amplifier 210 is disabled.

Since the first local data line pair SIO and SIOB is precharged to the power supply voltage VDD or a half of the power supply voltage VDD while a data is not transferred, according to the prior art, a voltage level of a bit line (SA_/BL in this case) amplified to the ground voltage by the bit line sense amplifier 210 is increased to predetermined voltage level during transferring a data amplified by the bit line sense amplifier 210. Accordingly, an enough time for the restore time should be provided for the increased voltage level of the bit line /BL to be decreased to the ground voltage. Otherwise, a wrong data can be restored to the original unit cell; particularly, if an original data is '0', the original data is restored as '1'. For overcoming the above-mentioned problem, a period of the restore step (t4) should be long according to the prior art.

However, in accordance with the present invention, since the bit line SA_BL is amplified to the low voltage VBB which is lower than the ground voltage GND, even though a current is flown to the bit line /BL coupled to the bit line sense amplifier by the first local data line pair SIO and SIOB, a voltage level of the bit line /BL coupled to the bit line sense amplifier is not increased because the flown current is compensated by the bit line having the low voltage VBB. Even though the voltage level of the bit line /BL is increased, the voltage level of the bit line /BL is not higher than a voltage level of the ground voltage GND at least. Accordingly, the period of the restore step (t4) can be decreased in comparison with the prior art.

Thereafter, when the precharge signal BLEQ_H is activated as a logic high level, the bit lines BL and /BL have a same voltage level and are floated. Also, the first and the second connection signals BISH and BISL are provided as the low voltage VBB_H and, thus, all of the bit lines BL, SA_BL, Bot_BL, /BL, SA_/BL and /Bot_BL are connected (t5).

As above-mentioned, at an initial state of the precharge step, the bit lines BL and /BL keep a voltage level of a half of the power supply voltage; however, the voltage level of the bit lines BL and /BL is decreased as time passes because the bit lines BL and /BL are floated not receiving a particular precharge voltage.

Meanwhile, while the first connection unit 250a is enabled, the second reference cell block 400b and the second precharge unit 220b are enabled so that a voltage level of the second bit line Bot_BL and the second bit line bar /Bot_BL is maintained as a precharge voltage. In accordance with the present invention, while voltage levels of a bit line pair are maintained to have a same voltage level at the precharge step, the bit line pair is floated not being supplied with a special precharge voltage. Therefore, there is no particular precharge voltage which all of the bit lines keep at the precharge step.

However, the precharge voltage means a half of the power supply voltage which a bit line pair keeps when the bit line pair has a same voltage level after one of the bit line pair has a voltage level of the power supply voltage and the other has a voltage level of the ground voltage after performing a data read or write operation. That is, while the bit line sense amplifier 210 accesses a data of a unit cell, a voltage level of a bit line pair which shares the bit line sense amplifier 210 and is not connected to the bit line sense amplifier 210 is maintained as the half of the power supply voltage by using a corresponding precharge unit and a reference cell block. This operation of the reference block is shown in FIG. 11. Since a voltage level of a bit line included in an inactivated cell array is rapidly decreased due to a voltage difference between the power supply terminal (SAP) of the bit line sense amplifier which operates for accessing a data and a voltage level of the bit line included in the inactivated cell array, the above-mentioned operation is needed.

Although MOS transistors which receive the first or the second connection control signals BISL or BISH are provided between the power supply terminal SAP and the inactivated cell array, and even though the MOS transistors are turned off, a sub-current still flows and the bit line included in the inactivated cell array is rapidly decreased due to a leakage current of the sub-current. If a size of the MOS transistor is larger, the above-mentioned problem becomes more serious.

Generally, a semiconductor memory device keeps a precharge voltage as VDD/2. Herein, in a shared structure, when the bit line sense amplifier senses and amplifies a voltage difference between a bit line pair coupled to one side of the bit line amplifier for a data accessing, the other bit line pair which does not serve to access a data and is coupled to the other side of the bit line sense amplifier keeps a precharge voltage level of VDD/2. However, there occurs an error since the precharge voltage level is decreased due to a voltage difference between the precharge voltage and a ground voltage supply terminal of a bit line.

In accordance with the present invention, since a bit line pair which does not serve to access a data is floated at the precharge step, the above-mentioned problem does not occur. However, if the precharge voltage is maintained as a VDD/2, a data access operation can be performed more effectively since the precharge voltage level of VDD/2 is the most effective for sensing a high-level data and a low-level data.

Since the semiconductor memory device in accordance with the present invention maintains a voltage level of a bit line pair which neighbors with a bit line pair served for a data access as the VDD/2 by using a reference cell block and a precharge unit, all of bit line pairs which neighbor with the data accessing bit line pair can keep a voltage level of VDD/2. Accordingly, a precharge voltage can be secured no generating a particular control signal.

The above-mentioned operation of the semiconductor memory device is described on the assumption that a data '1' is read out. Hereinafter, an operation of the semiconductor memory device for read a data '0' is described below.

In case that a data to be read is '0', a capacitor of a selected unit cell is discharged. Accordingly, a voltage level of the first bit line BL receiving a data signal is not changed at the read step after the precharge step (t2). That is, a voltage level of the first bit line BL keeps a voltage level of the ground voltage.

Meanwhile, since the first bit line bar /BL receives a reference signal, a voltage level of the first bit line bar /BL is increased by a predetermined voltage level. Herein, an amount of the voltage increase of the first bit line bar /BL is determined by a charge quantity corresponding to the reference signal, i.e., a charge quantity stored in the reference capacitor Top_RC.

Thereafter, the bit line sense amplifier 210 senses the voltage difference between the first bit line BL and the first bit line bar /BL and amplifies a voltage level of the bit line BL and a voltage level of the first bit line bar /BL to the low voltage VBB and to the power supply voltage VDD respectively, then, the bit line sense amplifier 210 latches the amplified voltage levels. Herein, a voltage level of the first bit line BL included in the first cell array 300a is maintained as the ground voltage by the first connection unit 250a.

Since the remaining operations for reading '0' is same to that for reading '1', detailed descriptions are omitted.

Hereinafter, an operation of the semiconductor memory device for writing a data is described below.

The write operation is very similar to the read operation. While a data signal sensed and amplified by the bit line sense amplifier 210 is outputted to the first local data line LDB and LDBB during t3 at the read operation, a data signal inputted according to a write command is transferred to the write driver unit through the input/output pad and the data input/output buffer at the write operation. Then, the data signal outputted from the write driver unit is delivered to the bit line sense amplifier 210 through the first and the second local data lines.

Then, the bit line sense amplifier 210 replaces a previously latched data signal with the delivered data signal, and the newly latched data signal is stored to a unit cell at the restore step (t4). The bit line sense amplifier 210 also performs a sensing and amplifying operation by using the power supply voltage VDD and the low voltage VBB at the write operation.

In accordance with the preferred embodiment of the present invention, since the semiconductor memory device includes the I/O switching unit having a PMOS transistor for transferring a data signal to be written and processes a low-level data as a voltage level of the low voltage VBB_SA, a write operation speed can be improved. Particularly, since the data input/output unit 240 is constituted with an NMOS transistor, while a high-level data can be relatively stably transferred, there may be a signal loss of a low-level data during transferring the low-level data.

Therefore, for improving an operational margin at the write operation, the I/O switching unit is mainly constituted with a PMOS transistor and a low voltage level signal can pass through the first and the second local data lines. A low-level data signal transferred by the first and the second local data lines is controlled to be same to the low voltage VBB_SA or not to be smaller than the low voltage VBB_SA at least. For stably performing this operation, the low voltage level VBB_BIS, which is used for activating a control signal for turning on a PMOS transistor included in the I/O switching unit, is lower than the low voltage VBB_SA for transferring a data signal.

As above-mentioned, the semiconductor memory device floats a bit line at the precharge step, and the bit line sense amplifier 210 senses and amplifies a voltage difference between two bit lines BL and /BL by using the power supply voltage VDD and the low voltage VBB.

Effective advantages of the semiconductor memory device in accordance with the present invention are described below.

Firstly, since a particular precharge voltage is not needed to be supplied at the precharge step, a power consumption at the precharge step can be reduced. That is, according to the prior art, since a power supply voltage or a half of a power supply voltage is provided for the precharge step, a predetermined amount of power is consumed. However, since the semiconductor memory device in accordance with the present invention does not need an additional power for the precharge step, a power consumption can be dramatically reduced.

Secondly, a bleed current caused by a short-circuit between a word line and a bit line of a unit cell can be prevented. As above-mentioned, since the bleed current is still generated after a word line is replaced with a redundancy word line, a power is unnecessarily consumed. However, in accordance with the present invention, there is no particular precharge voltage for a bit line and a bit line is floated. Therefore, a bit line has a voltage level of a ground voltage and, thus, the bleed current can be prevented because there is no voltage difference between a word line and a bit line. Herein, at an initial state of the precharge step, since a bit line has a predetermined voltage level, a little bleed current may be generated; however, the bleed current is not generated after a voltage level of the floated bit line becomes a ground voltage.

Thirdly, since a bit line sense amplifier performs a sensing and amplifying operation by using the power supply voltage VDD and the low voltage VBB which is lower than the ground voltage, a data signal delivered to a bit line can sensed and amplified by a bit line sense amplifier at a high speed even though the power supply voltage VDD is low. Also, an absolute quantity of the low voltage VBB may be same to that of the power supply voltage VDD as an operational voltage of the semiconductor memory device is decreased. In this case, a half of the power supply voltage VDD becomes the ground voltage. Accordingly, the bit line sense amplifier amplifies a high-level data and a low level data to the power supply voltage VDD and to the low voltage VBB respectively and, then, at the precharge step, a voltage level of a bit line pair is maintained as the ground voltage VSS.

Fourthly, since a high-level data and a low level data are processed by using the power supply voltage and the low voltage respectively, a read/write operation can be performed at a high speed even though the power supply voltage is very small.

Fifthly, according to the prior art, since the precharge voltage level is the power supply voltage or a half of the power supply voltage, a current is flown from a data line to a bit line and, thus, a voltage level of a bit line amplified to a low level is temporarily increased. However, in accordance with the present invention, since the bit line sense amplifier amplifies a voltage level of a bit line to a negative low voltage, the current flown from the data line is compensated by the negative low voltage. Therefore, a voltage level of the bit line is not increased more than the ground voltage. As a result, a period of the restore step can be decreased and a cycle time also can be decreased.

Sixthly, since the semiconductor memory device is operated by using a low voltage restraining using a high voltage, a power consumption for generating the high voltage can be reduced. That is, an absolute quantity of the low voltage is smaller than that of the high voltage and characteristics of the low voltage is better than that of the high voltage.

Lastly, a voltage level of a bit line pair which is not connected to the bit line sense amplifier is maintained as a voltage level of VDD/2 while the bit line sense amplifier senses and amplifies a bit line pair connected to the bit line sense amplifier. Accordingly, a sub-current of a MOS transistor included in a connection unit is prevented and, thus, a leakage current generated during a data sensing operation can be prevented.

As a result, in accordance with the present invention, the semiconductor memory device can perform a data access operation at a high speed under a low operational voltage.

Figure 13:
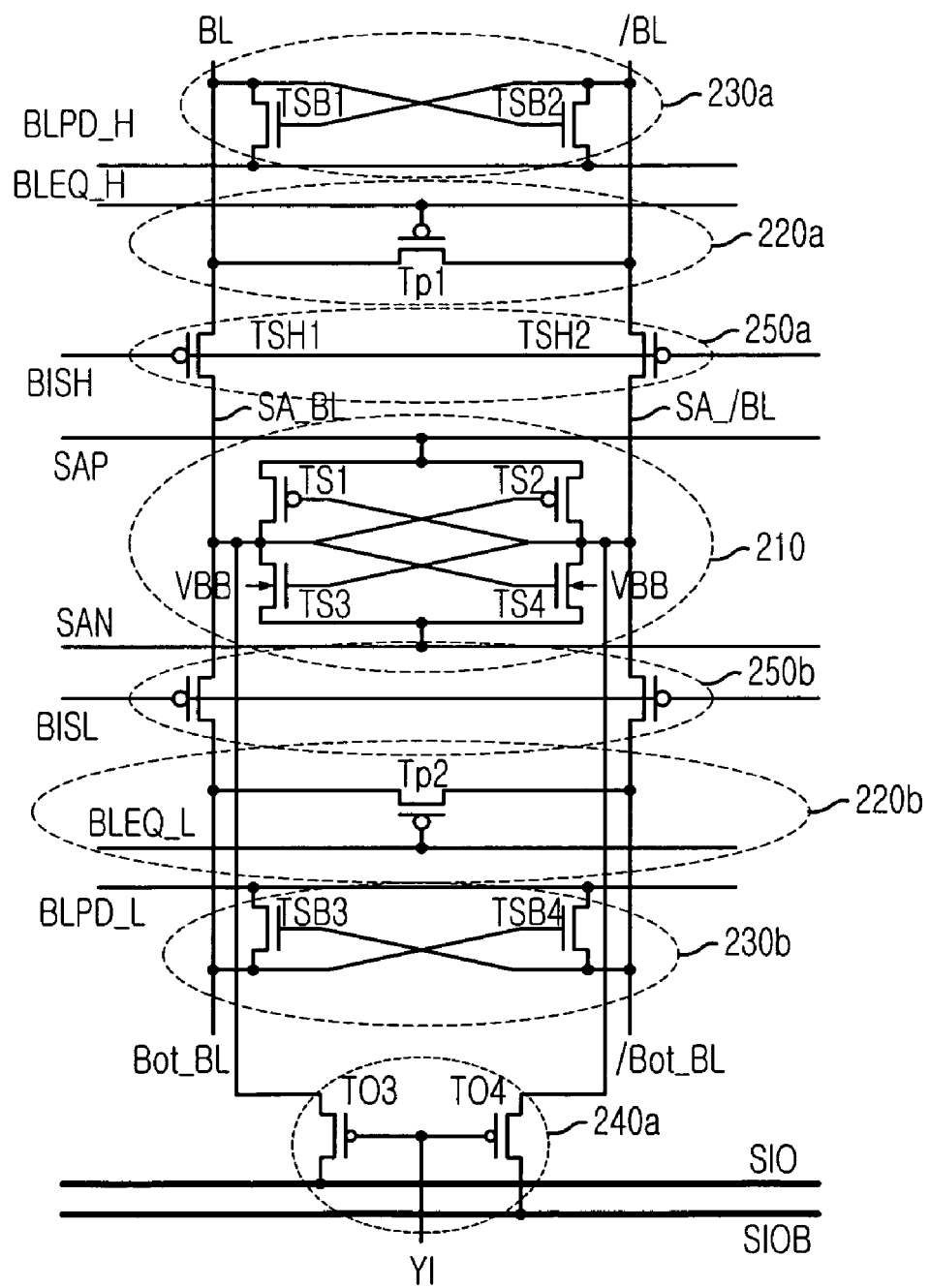
FIG. 13 is a schematic circuit diagram showing a bit line sense amplifier in accordance with an embodiment of the present invention.

FIG. 13 is a schematic circuit diagram showing a bit line sense amplifier in accordance with another embodiment of the present invention.

As shown, a structure of the bit line sense amplifier is almost same to that of the bit line sense amplifier shown in FIG. 10 except that a data input/output unit 240a is constituted with a PMOS transistor.

According to a characteristic of a PMOS transistor, a transfer of a high-level data from the bit line sense amplifier to the first local data line is relatively easier. That is, if a voltage level of the power supply voltage is decreased, a voltage level of the high-level data is decreased and, thus, a transfer of the high-level data is difficult. For overcoming this problem, the data input/output unit 240 includes a PMOS transistor. Herein, a weak point of a PMOS transistor for transferring a low-level data, i.e., a signal loss of the low-level data, is compensated by transferring the low-level data as the low voltage level.

Figure 14:
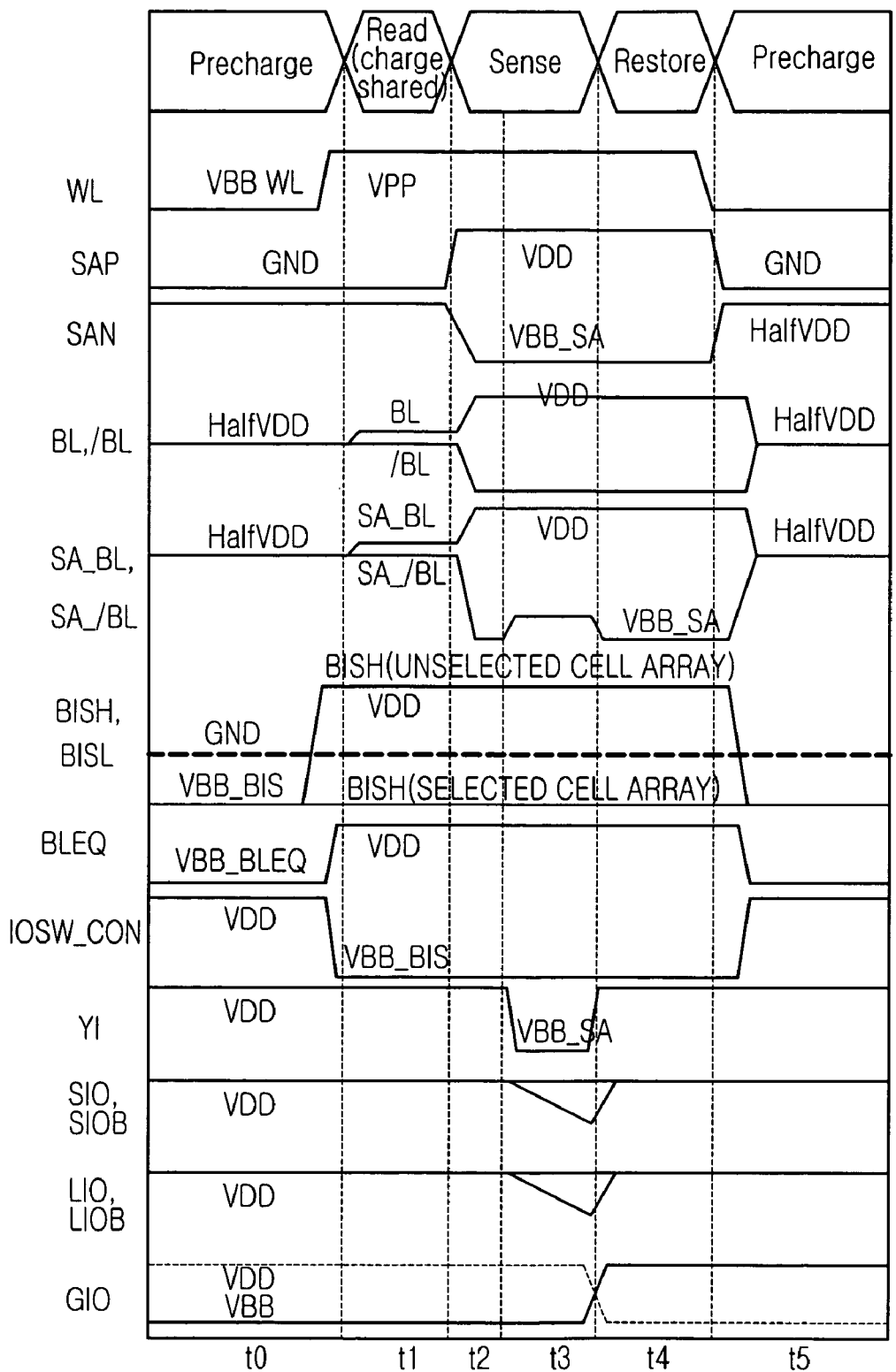
FIG. 14 is a timing diagram showing a read operation of a semiconductor memory device in accordance with an embodiment of the present invention.

FIG. 14 is a timing diagram showing a read operation of the semiconductor memory device in accordance with the embodiment of the present invention.

Figure 15:
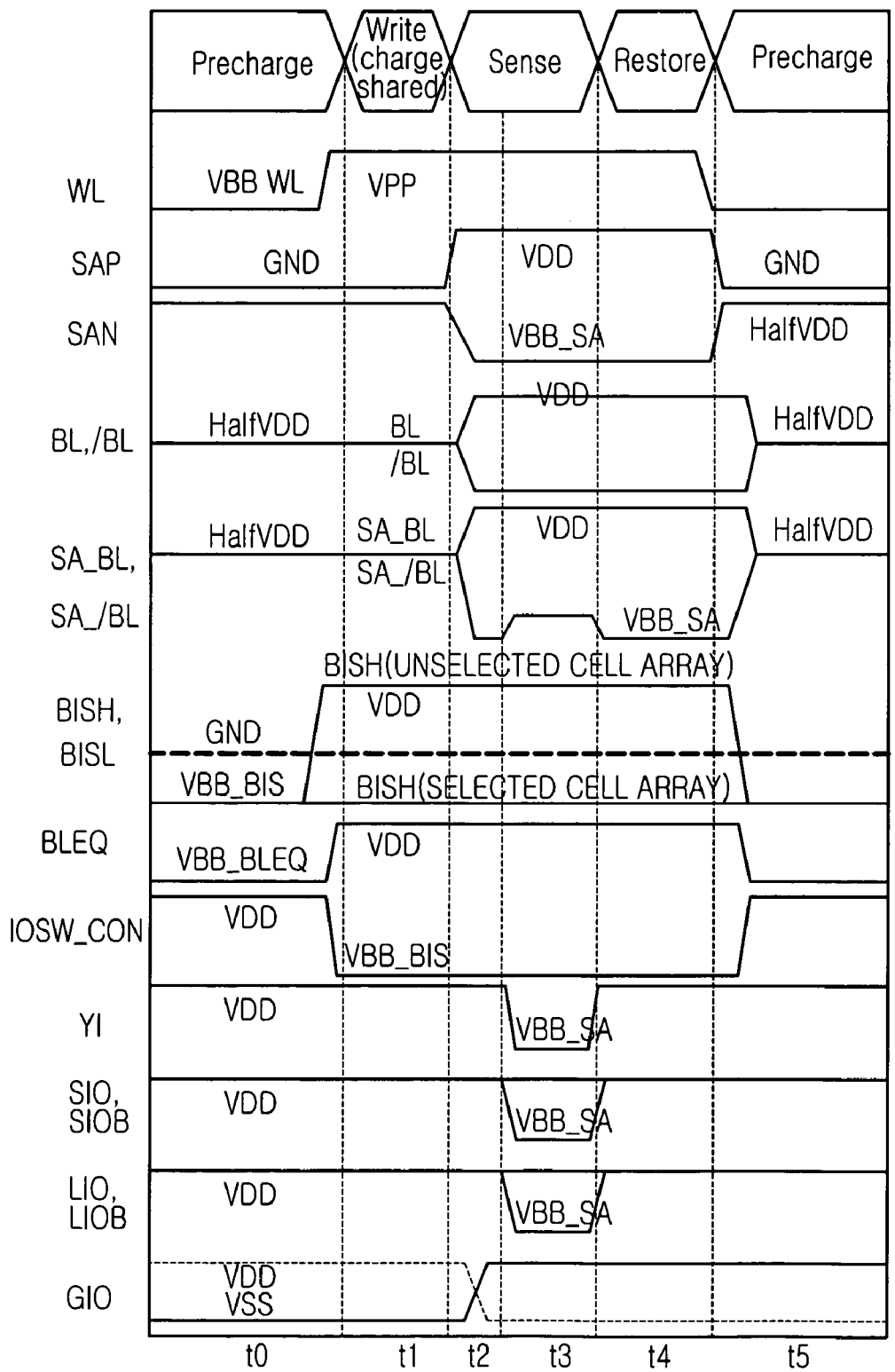
FIG. 15 is a timing diagram showing a write operation of a semiconductor memory device in accordance with an embodiment of the present invention.

FIG. 15 is a timing diagram showing a write operation of the semiconductor memory device in accordance with the embodiment of the present invention.

The read/write operation of the semiconductor memory device shown in FIGS. 14 and 15 is almost same to that of the semiconductor memory device shown in FIGS. 11 and 12.

However, since the data input/output unit 240a is constituted with a PMOS transistor, a low voltage level of VBB_SA is provided for activating the data input/output unit 240a.

In addition, various changes and modifications may be made without departing from the spirit and scope of the invention. For instance, the present invention can be applied to a conventional semiconductor memory device which maintains a precharge voltage as a voltage level of VDD/2. In this case, the above-mentioned reference cell block is not needed.

A semiconductor memory device in accordance with an embodiment of the present invention improves an operational speed not using a high voltage under a low power supply voltage condition and for improving an operational margin at a read/write operation under the low power supply voltage condition The present application contains subject matter related to Korean patent application No. 2005-27341, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a read amplifying unit for transferring a read data from a local data line pair to a global data line;
   a write driver for transferring a write data from the global data line to the local data line pair;
   an input/output (I/O) switching unit provided with a plurality of PMOS transistors for transferring the read data from a segment data line pair to the local data line pair and for transferring the write data from the local data line pair to the segment data line pair; and
   a bit line sense amplifier for sending and amplifying a data signal inputted to a bit line pair,
   wherein one of the bit line pair having a higher voltage level is amplified to a power supply voltage level and the other having a lower voltage level is amplified to a low voltage level lower than a ground voltage level.

2. The semiconductor memory device as recited in claim 1, wherein the I/O switching unit includes:
   first and second PMOS transistors, whose gates are connected to each other, for connecting the local data line pair and the segment data line pair in response to a data transfer control signal;
   a third PMOS transistor for equalizing the segment data line pair in response to a precharge control signal activated during a precharge period, the third PMOS transistor coupled between first terminals of the first and the second PMOS transistors; and
   a fourth PMOS transistor for equalizing the local data line pair in response to the precharge control signal, the fourth PMOS transistor coupled between second terminals of the first and the second PMOS transistors.

3. The semiconductor memory device as recited in claim 2, further comprising:
   a first cell array for providing a data to the bit line sense amplifier through a first bit line pair; and
   a first connection unit for selectively connecting the first cell array to the bit line sense amplifier.

4. The semiconductor memory device as recited in claim 3, further comprising:
   a first precharge unit for equalizing voltage levels of the first bit line pair during the precharge period; and
   a first reference cell block for supplying a reference signal to the first bit pair,
   wherein the first bit line pair is floated during the precharge period without providing a precharge voltage.

5. The semiconductor memory device as recited in claim 4, wherein the first precharge unit includes a first precharge PMOS transistor for connecting the first bit line pair at the precharge period.

6. The semiconductor memory device as recited in claim 5, wherein the first reference cell block includes:
   a first reference capacitor whose first terminal is coupled to a reference power supply voltage terminal providing a reference signal;
   a first switch for connecting a second terminal of the first reference capacitor to one of the first bit line pair when a data signal is delivered to the other of the first bit line pair; and
   a second switch for connecting the second terminal of the first reference capacitor to the other of the bit line pair when the data signal is delivered to the one of the first bit pair.

7. The semiconductor memory device as recited in claim 6, wherein the first connection unit includes:
   a first connecting PMOS transistor for connecting the one of the first bit line to the bit line pair sense amplifier in response to a connection control signal; and
   a second connecting PMOS transistor for connecting the other of the first bit line pair to the bit line sense amplifier in response to the connection control signal.

8. The semiconductor memory device as recited in claim 7, further comprising a first auxiliary bit line sense amplifier arranged between the first cell array and the first connection unit, the first auxiliary bit line sense amplifier for maintaining one of the first bit line pair having a lower voltage level as the ground voltage.

9. The semiconductor memory device as recited in claim 8, further comprising:
   a second cell array for providing a data to the bit line sense amplifier through a second bit line pair; and
   a second connection unit for selectively connecting the second cell array to the bit line sense amplifier.

10. The semiconductor memory device as recited in claim 9, further comprising:
    a second precharge unit for equalizing the second bit line pair during the precharge period; and
    a second reference cell block for supplying a reference signal to the second bit line pair,
    wherein the second bit line pair is floated during the precharge period without providing a precharge voltage.

11. The semiconductor memory device as recited in claim 10, wherein the second precharge unit includes a second precharge PMOS transistor for connecting the second bit during the precharge period.

12. The semiconductor memory device as recited in claim 11, wherein the second reference cell block includes:
    a second reference capacitor whose first terminal is coupled to the reference power supply voltage terminal;
    a third switch for connecting a second terminal of the second reference capacitor to one of the second bit line pair when a data signal is delivered to the other of the second bit line pair; and
    a fourth switch for connecting the second terminal of the second reference capacitor to the other of the second bit line pair when the data signal is delivered to the one of the second bit line.

13. The semiconductor memory device as recited in claim 12, wherein the second connection unit includes:
    a third connecting PMOS transistor for connecting the one of the second bit line pair to the bit line sense amplifier in response to a connection control signal; and a fourth connecting PMOS transistor for connecting the other of the second bit line pair to the bit line sense amplifier in response to the connection control signal.

14. The semiconductor memory device as recited in claim 13, further comprising a second auxiliary bit line sense amplifier arranged between the second cell array and the second connection unit for maintaining one of the second bit line pair having a lower voltage level between the second bit line and the second bit line bar as the ground voltage.

15. The semiconductor memory device as recited in claim 14, wherein the bit line sense amplifier includes:
a first sense amplifying PMOS transistor whose gate is connected to the other of the first bit line pair through the first connection unit and to the other of the second bit line pair through the second connection unit, wherein a first terminal of the first sense amplifying PMOS transistor is coupled to a power supply voltage terminal and a second terminal of the first sense amplifying PMOS transistor is coupled to the first connection unit;
a second sense amplifying PMOS transistor whose gate is connected to the one of the first bit line pair through the first connection unit and to the one of the second bit line pair through the second connection unit, wherein a first terminal of the second sense amplifying PMOS transistor is coupled to the power supply voltage terminal and a second terminal of the second sense amplifying PMOS transistor is connected to the other of the first bit line pair through the first connection unit and to the other of the second bit line pair through the second connection unit;
a first sense amplifying NMOS transistor whose gate is connected to the other of the first bit line pair through the first connection unit and to the other of the second bit line pair through the second connection unit, wherein a first terminal of the first sense amplifying NMOS transistor is coupled to a low voltage terminal and a second terminal is connected to the one of the first bit line pair through the first connection unit and to the one of the second bit line pair through the second connection unit; and
a second sense amplifying NMOS transistor whose gate is connected to the one of the first bit line pair through the first connection unit and to the one of the second bit line pair through the second connection unit, wherein a first terminal of the first sense amplifying NMOS transistor is coupled to the low voltage terminal and a second of the first sense amplifying NMOS transistor terminal is connected to the other of the first bit line pair through the first connection unit and to the other of the second bit line pair through the second connection unit.

16. The semiconductor memory device as recited in claim 15, further comprising a data input/output unit for selectively connecting the bit line sense amplifier to a first local data line included in the first cell unit.

17. The semiconductor memory device as recited in claim 16, wherein the data input/output unit includes:
a first input/output PMOS transistor whose gate receives an input/output control signal, wherein a first terminal of the first input/output PMOS transistor is coupled to the second terminals of the first sense amplifying PMOS transistor and the first sense amplifying NMOS transistor and a second terminal of the first input/output PMOS transistor is coupled to the first data line pair; and
a second input/output PMOS transistor whose gate receives the input/output control signal, wherein a first terminal of the second input/output PMOS transistor is coupled to the second terminals of the second sense amplifying PMOS transistor and the second sense amplifying NMOS transistor and a second terminal of the first input/output PMOS transistor is coupled to a second data line pair included in the second cell unit.

18. A method for operating a semiconductor memory device provided with a power supply voltage and a ground voltage, comprising the steps of:
a) inputting signals to a bit line and a bit line bar corresponding to a stored data;
b) amplifying a higher voltage level between the bit line and the bit line bar to the power supply voltage and amplifying the lower voltage level to a low voltage which is lower than the ground voltage, and latching the amplified signals;
c) transferring the signal having the power supply voltage level and the signal having the low voltage level through a first and a second data lines; and
d) outputting a data corresponded to the transferred signal to the outside of the semiconductor memory device.

19. A method for operating a semiconductor memory device provided with a power supply voltage and a ground voltage, comprising the steps of:
a) inputting signals to a bit line and a bit line bar corresponding to a stored data;
b) amplifying a higher voltage level between the bit line and the bit line bar to the power supply voltage and amplifying the lower voltage level to a low voltage which is lower than the ground voltage, and latching the amplified signals;
c) receiving a data corresponding to a write command;
d) delivering a first signal having the power supply voltage level and a second signal having a low voltage level which is lower than the ground voltage to a first and a second data lines, wherein the first and the second signals correspond to the data;
e) replacing the latched signals with the first and the second signals; and
f) storing a data corresponded to the first and the second signals.

* * * * *